(12) United States Patent
Xu et al.

(10) Patent No.: US 10,546,957 B2
(45) Date of Patent: Jan. 28, 2020

(54) NANOSHEET FET INCLUDING ALL-AROUND SOURCE/DRAIN CONTACT

(71) Applicant: International Business Machines Corporation, Armonk, NY (US)

(72) Inventors: Peng Xu, Guilderland, NY (US); Chun Wing Yeung, Niskayuna, NY (US); Chen Zhang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/868,742

(22) Filed: Jan. 11, 2018

(65) Prior Publication Data

US 2019/0214502 A1    Jul. 11, 2019

(51) Int. Cl.
| | |
|---|---|
| *H01L 29/786* | (2006.01) |
| *H01L 29/06* | (2006.01) |
| *H01L 29/423* | (2006.01) |
| *H01L 29/417* | (2006.01) |
| *H01L 29/66* | (2006.01) |
| *H01L 21/02* | (2006.01) |
| *H01L 21/306* | (2006.01) |
| *H01L 21/768* | (2006.01) |

(52) U.S. Cl.
CPC .. *H01L 29/78618* (2013.01); *H01L 21/02603* (2013.01); *H01L 21/30604* (2013.01); *H01L 21/76805* (2013.01); *H01L 21/76895* (2013.01); *H01L 29/0673* (2013.01); *H01L 29/41733* (2013.01); *H01L 29/42392* (2013.01); *H01L 29/66742* (2013.01); *H01L 29/78696* (2013.01)

(58) Field of Classification Search
CPC ......... H01L 29/06; H01L 29/66; H01L 19/78; H01L 29/51; H01L 29/78618; H01L 29/0673; H01L 29/42392; H01L 29/41733; H01L 29/66742; H01L 21/02603; H01L 21/30604; H01L 21/76805; H01L 21/76895; H01L 29/78696; H01L 29/786; H01L 29/423; H01L 29/417; H01L 21/02; H01L 21/306; H01L 21/768
USPC ...................................................... 257/347
See application file for complete search history.

(56) References Cited

U.S. PATENT DOCUMENTS

| | | |
|---|---|---|
| 8,642,403 B1 | 2/2014 | Cohen |
| 8,692,229 B2 | 4/2014 | Cohen |
| 9,041,106 B2 | 5/2015 | Cappellani |
| 9,362,355 B1 | 6/2016 | Cheng et al. |
| 9,406,804 B2 | 8/2016 | Huang |
| 9,472,399 B2 | 10/2016 | Cappellani |

(Continued)

*Primary Examiner* — Alexander O Williams
(74) *Attorney, Agent, or Firm* — Cantor Colburn LLP; Vazken Alexanian

(57) ABSTRACT

A semiconductor device includes a semiconductor wafer having one or more suspended nanosheet extending between first and second source/drain regions. A gate structure wraps around the nanosheet stack to define a channel region located between the source/drain regions. The semiconductor device further includes a first all-around source/drain contact formed in the first source/drain region and a second all-around source/drain contact formed in the second source/drain region. The first and second all-around source/drain contacts each include a source/drain epitaxy structure and an electrically conductive external portion that encapsulates the source/drain epitaxy structure.

16 Claims, 27 Drawing Sheets

(56) References Cited

U.S. PATENT DOCUMENTS

| | | |
|---|---|---|
| 9,484,423 B2 | 11/2016 | Obradovic |
| 9,570,609 B2 | 2/2017 | Obradovic |
| 9,653,289 B1* | 5/2017 | Balakrishnan ........ H01L 27/088 |
| 9,991,254 B1* | 6/2018 | Cheng ............... H01L 21/02532 |
| 9,991,352 B1* | 6/2018 | Frougier ................ B82Y 10/00 |
| 10,002,939 B1* | 6/2018 | Cheng .................. H01L 29/511 |
| 10,032,867 B1* | 7/2018 | Yeung .............. H01L 29/66439 |
| 10,243,054 B1* | 3/2019 | Cheng ............... H01L 29/42376 |
| 10,249,541 B2* | 4/2019 | Cheng ................ H01L 29/4908 |
| 10,263,100 B1* | 4/2019 | Bi .................... H01L 29/66795 |
| 10,276,442 B1* | 4/2019 | Xie ................. H01L 21/823418 |
| 2014/0001441 A1 | 1/2014 | Kim et al. |
| 2014/0017890 A1 | 1/2014 | Cohen |
| 2015/0255280 A1 | 9/2015 | Cappellani |
| 2015/0295089 A1 | 10/2015 | Huang |
| 2016/0126310 A1* | 5/2016 | Rodder ............. H01L 29/41758 |
| | | 257/9 |
| 2016/0329416 A1 | 11/2016 | Huang |
| 2017/0025499 A1 | 1/2017 | Cappellani |
| 2017/0222006 A1* | 8/2017 | Suh .................... H01L 23/5283 |
| 2018/0219083 A1* | 8/2018 | Guillorn .......... H01L 29/66553 |
| 2018/0254329 A1* | 9/2018 | Guillorn .......... H01L 29/42364 |

* cited by examiner

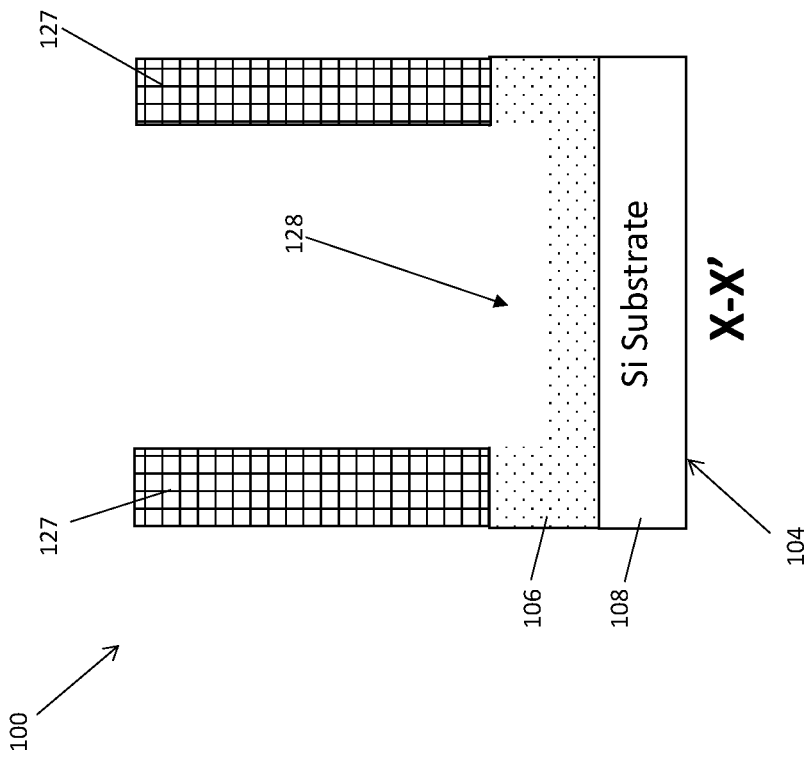
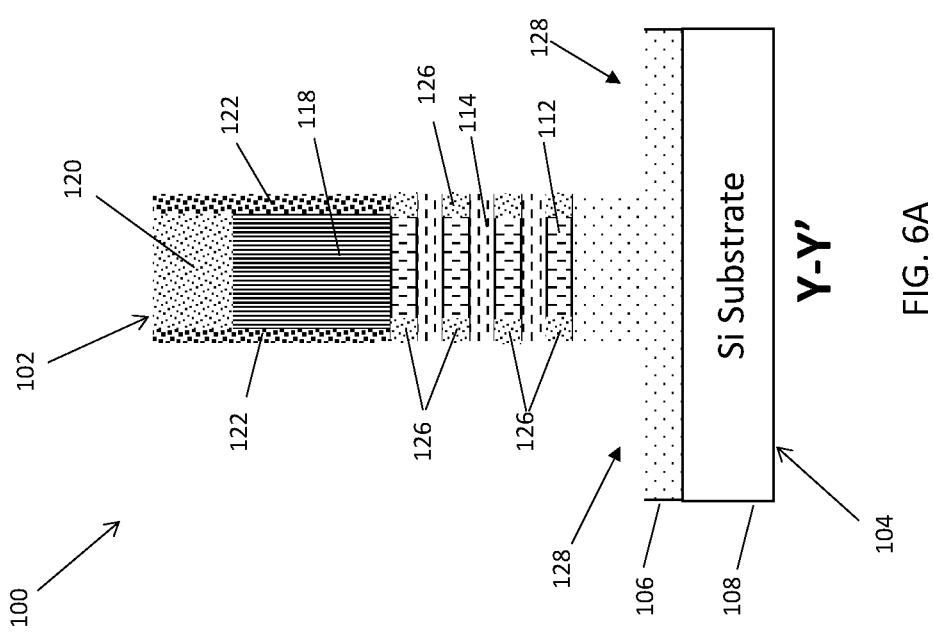
FIG. 6B
FIG. 6A

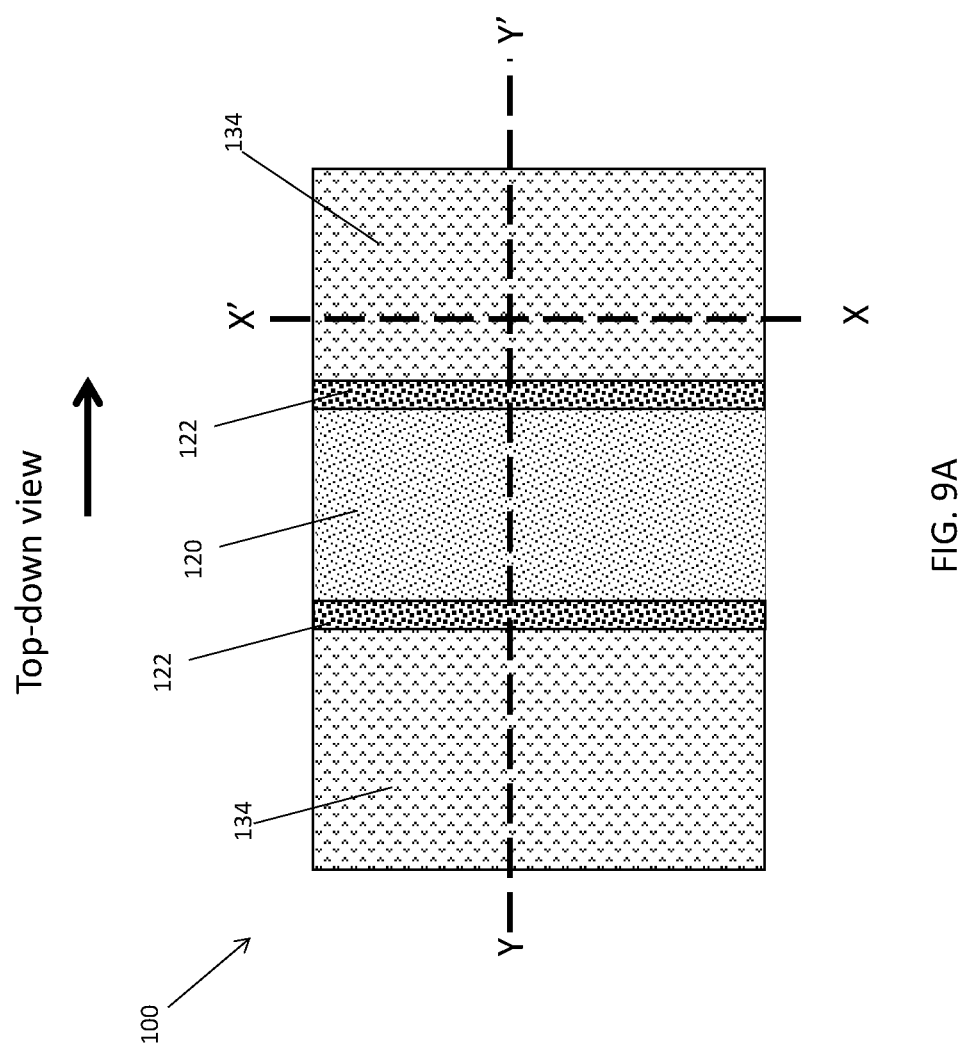

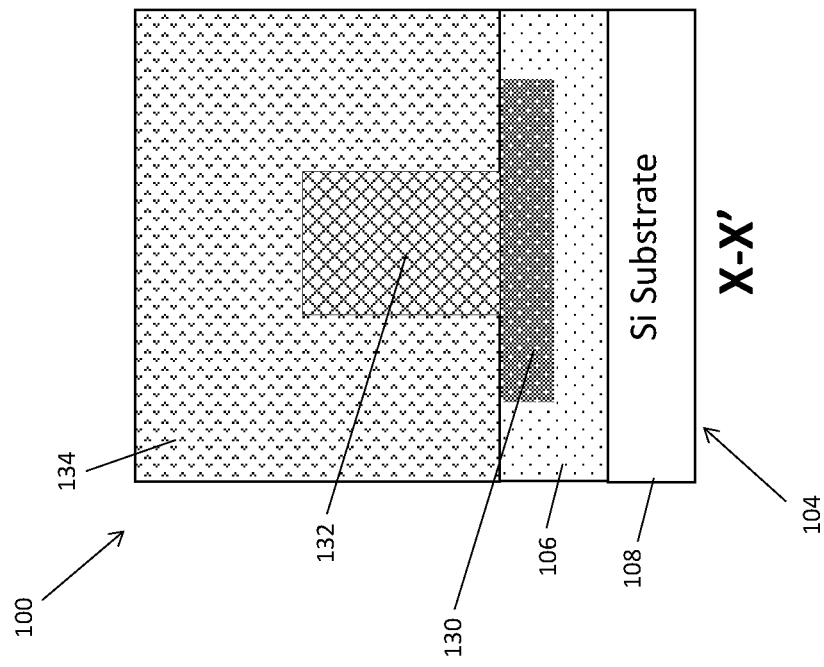
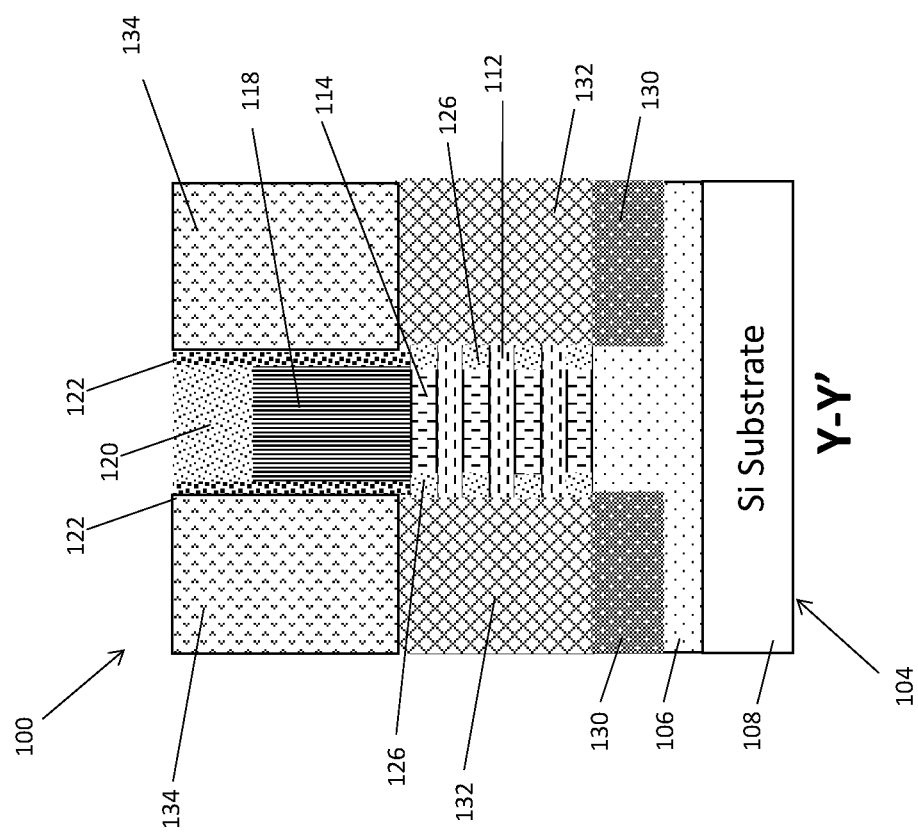

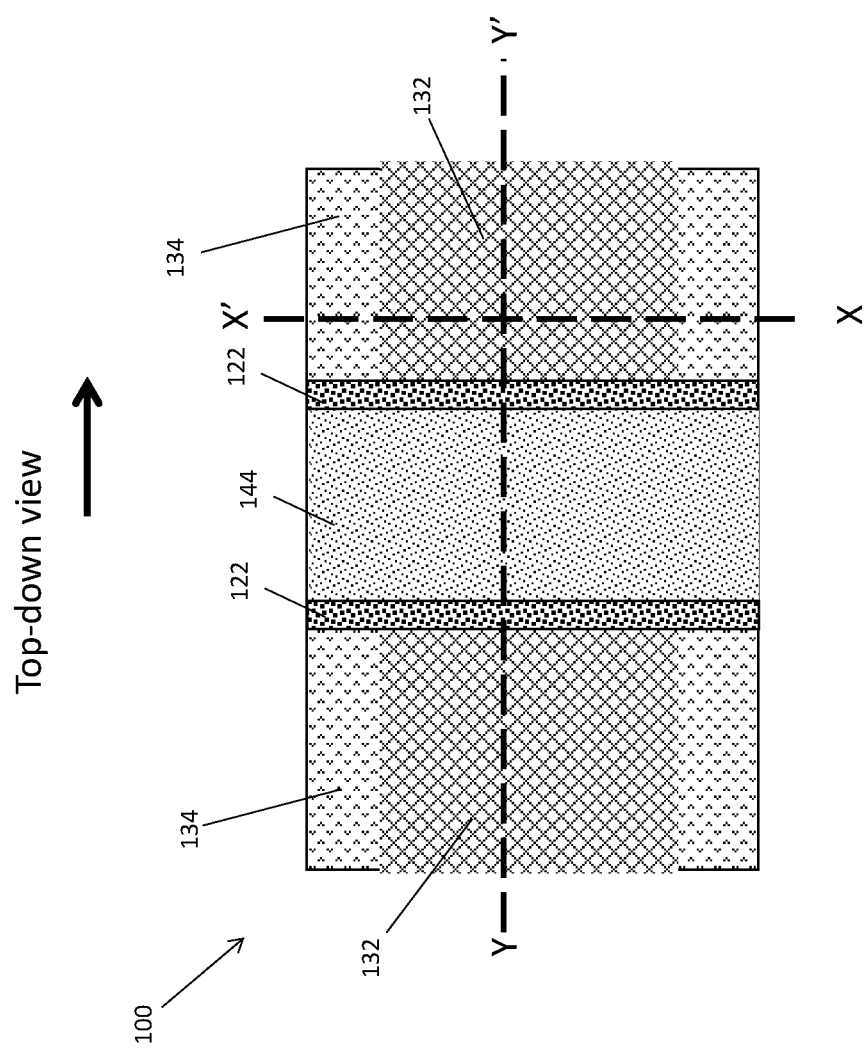

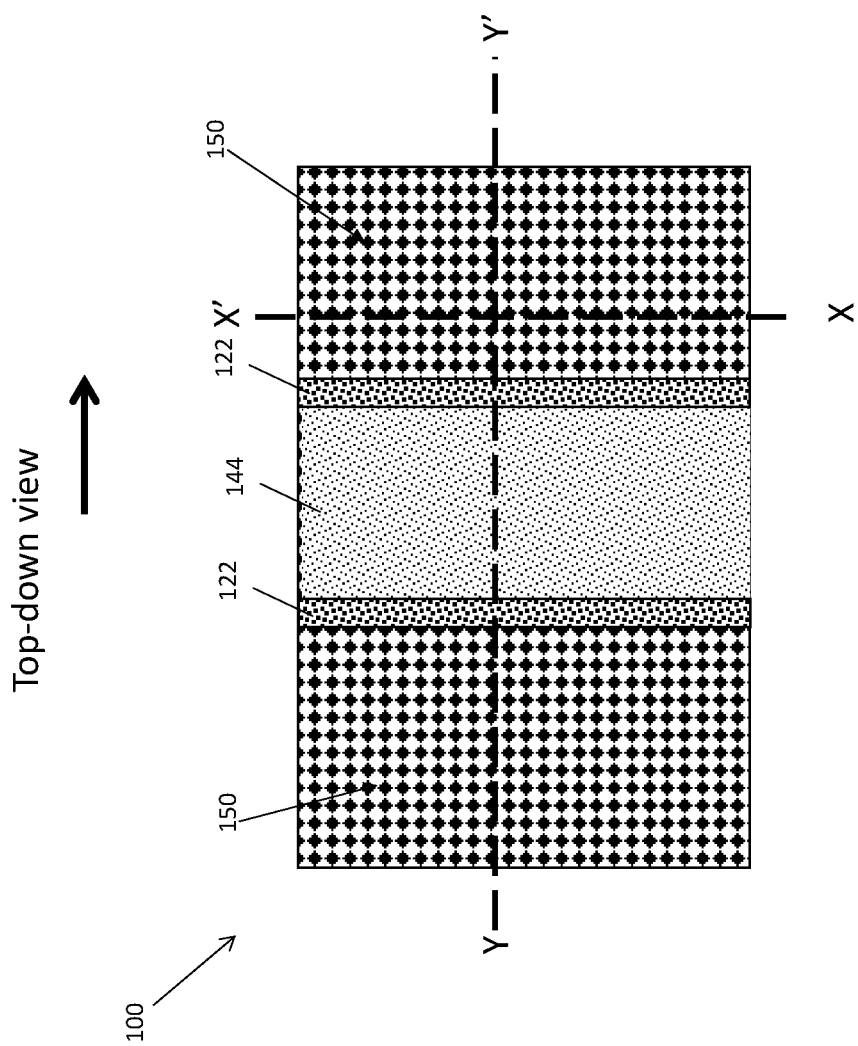

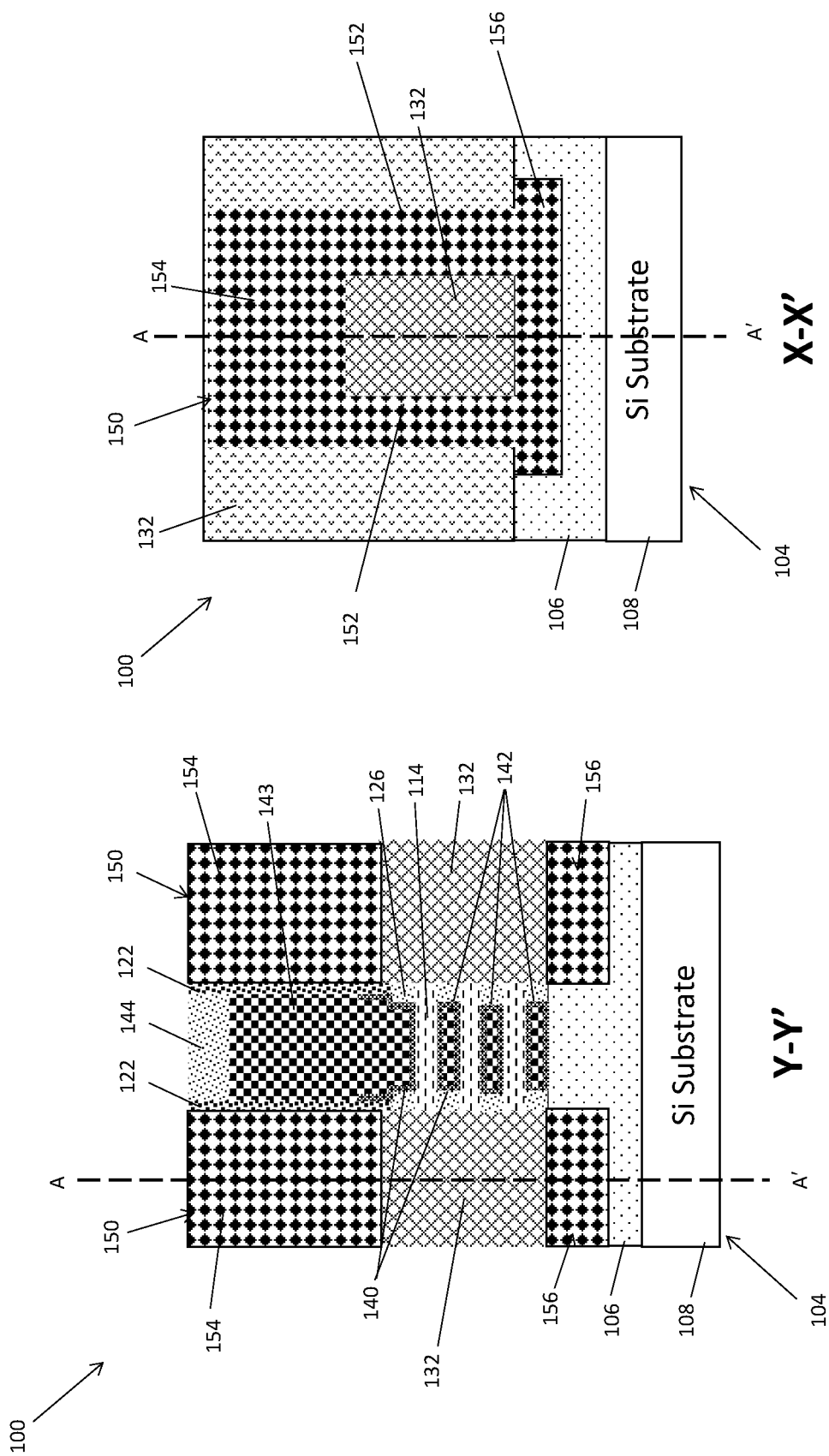

NANOSHEET FET INCLUDING ALL-AROUND SOURCE/DRAIN CONTACT

BACKGROUND

The present invention generally relates to fabrication methods and resulting structures for semiconductor devices. More particularly, the present invention relates to nanosheet field effect transistors (FETs).

As semiconductor integrated circuits (ICs) or chips become smaller, the implementation of stacked nanosheets in semiconductor devices has increased. Nanosheets are referred to as two-dimensional nanostructures with a thickness range on the order of about 1 nanometer (nm) to about 100 nm, and can facilitate the fabrication of non-planar semiconductor devices having a reduced footprint compared to conventional planar-type semiconductor devices. Accordingly, nanosheets and nanowires are seen as a feasible device options for reducing the footprints of semiconductor devices to 7 nanometers and beyond.

SUMMARY

Embodiments of the present invention are directed to a semiconductor device. A non-limiting example of the semiconductor device includes a semiconductor wafer having one or more suspended nanosheet extending between first and second source/drain regions. A gate structure wraps around the nanosheet stack to define a channel region located between the source/drain regions. The semiconductor device further includes a first all-around source/drain contact formed in the first source/drain region and a second all-around source/drain contact formed in the second source/drain region. The first and second all-around source/drain contacts each include a source/drain epitaxy structure and an electrically conductive external portion that encapsulates the source/drain epitaxy structure.

Embodiments of the present invention are directed to a method of fabricating a semiconductor device. A non-limiting example of the method includes forming at least one semiconductor nanosheet in a channel region of a semiconductor wafer. The method further includes covering a first source/drain epitaxy structure formed on first sacrificial region with a first interlayer dielectric (ILD), and covering the second source/drain epitaxy structure formed on a second sacrificial layer with a second ILD. The method further includes replacing the first and second sacrificial regions and a portion of the first and second ILDs with an electrically conductive material to form an all-around source/drain contact that encapsulates the first and second source/drain epitaxy structures.

Additional embodiments of the present invention are directed to a method of fabricating a nanosheet field effect transistor (FET). A non-limiting example of the method includes forming on a semiconductor wafer, a nanosheet stack, and forming a gate structure that wraps around a portion of the nanosheet stack to define a channel region of the nanosheet FET. The method further includes forming first and second sacrificial regions on the semiconductor substrate. The gate structure is used to self-align the first and second sacrificial regions with respect to sidewalls of the nanosheet stack. The method further includes growing, from the first sacrificial region, a first source/drain epitaxy structure that contacts a first side of the nanosheet stack, and growing, from the second sacrificial region, a second source/drain epitaxy structure that contacts an opposing second side of the nanosheet stack. The method further includes replacing the first and second sacrificial regions with an electrically conductive material to form an all-around source/drain contacts that encapsulate the source/drain epitaxy structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6A is a cross-section view of the semiconductor device taken along line Y-Y after transferring the pattern into a buried insulator layer to form trenches;

FIG. 6B depicts the semiconductor device of taken along line X-X';

FIG. 9A depicts a top view of the semiconductor device after depositing an inter-layer dielectric (ILD);

FIG. 9B depicts the semiconductor device of FIG. 8A taken along line Y-Y';

FIG. 9C depicts the semiconductor device of FIG. 9A taken along line X-X';

FIG. 15A depicts a top view of the semiconductor device after removing the sacrificial material;

FIG. 16A depicts a top view of the semiconductor device after forming a pair of all-around source/drain contacts;

FIG. 16B depicts the semiconductor device depicts the semiconductor device of FIG. 16A taken along line Y-Y';

FIG. 16C depicts the semiconductor device of FIG. 16A taken along line X-X';

Figure 1A:
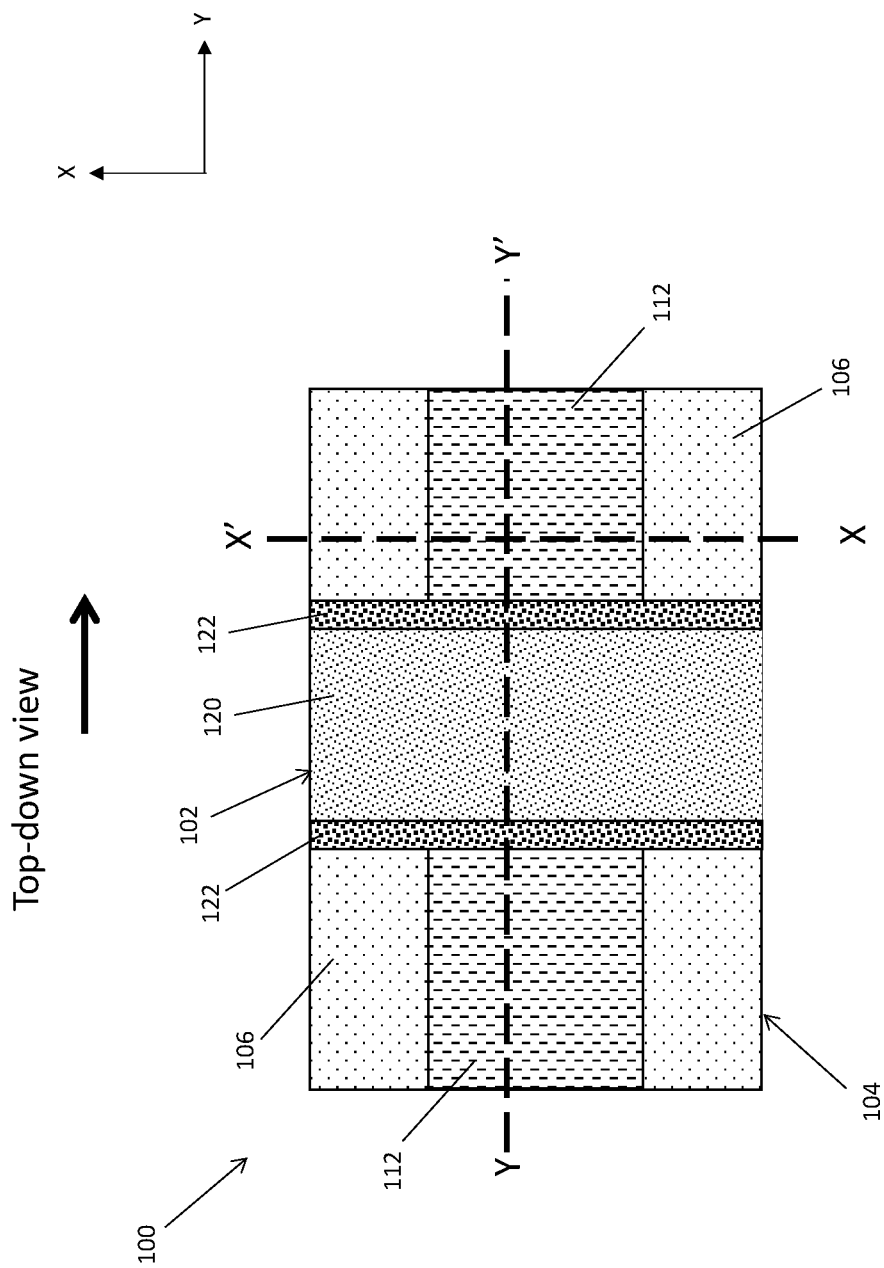
FIG. 1A depicts a top view of a semiconductor device at an intermediate stage of a semiconductor fabrication process flow.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the invention, nanosheet semiconductor devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced. As a result, the overall resistance in the source/drain region increases, which can reduce the overall performance of the device.

Turning now to an overview of the aspects of the invention, one or more embodiments of the invention address the above-described shortcomings of the prior art by providing a nanosheet FET including an all-around source/drain contact, which encapsulates the source/drain epitaxy structure. In other words, instead of providing a contact interface between only the upper surface of the source/drain epitaxy structure and the lower surface of the metal source/drain contact as found in the prior art, one or more embodiments of the invention provides an all-around source/drain contact that increases the total contact area between the source/drain epitaxy structure and the metal source/drain contact. In this manner, the shortcomings of the prior art are addressed by providing a nanosheet FET with a reduced footprint while also having reduced contact resistance in the source/drain regions.

Figure 1C:
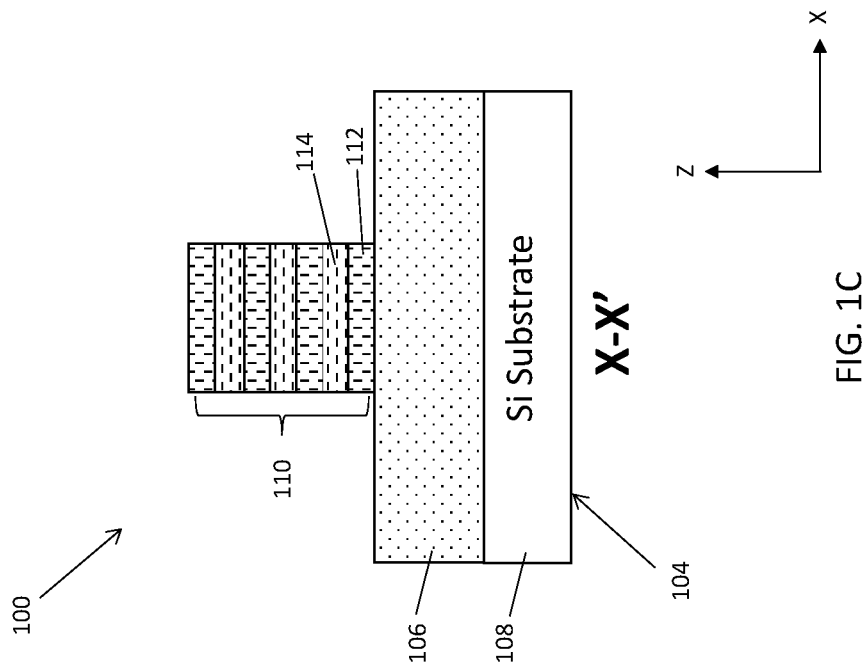
FIG. 1C depicts the semiconductor device of FIG. 1A taken along line X-X'.
Figure 1B:
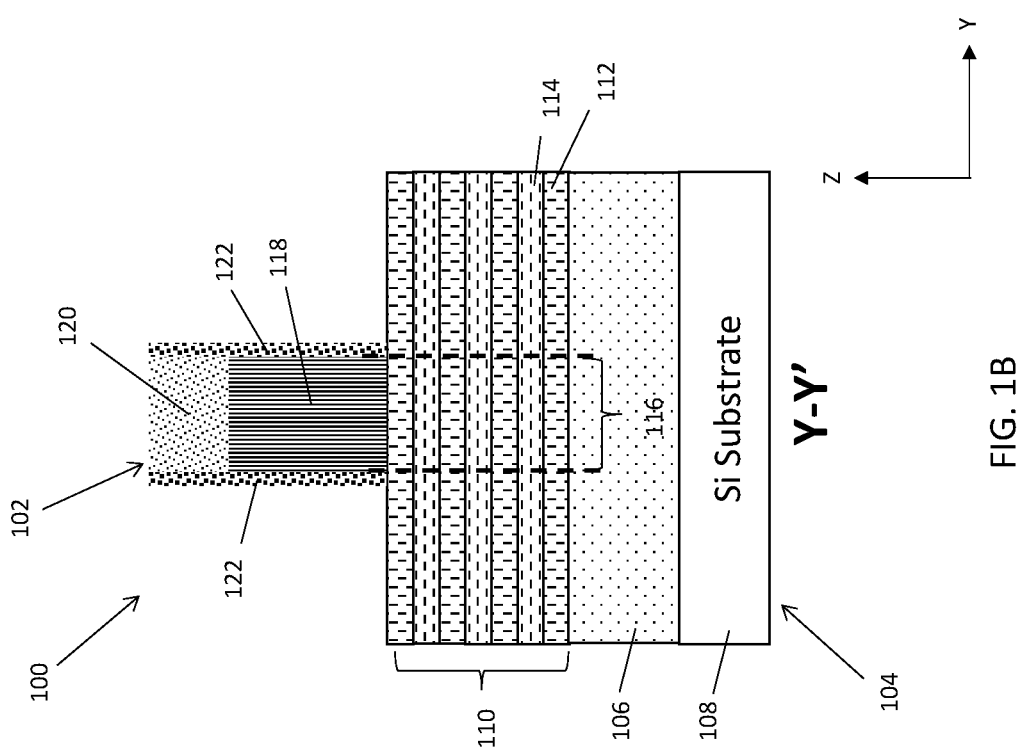
FIG. 1B depicts the semiconductor device of FIG. 1A taken along line Y-Y'.

Turning now to a more detailed description of aspects of the present invention, a non-limiting nanosheet FET fabrication process flow is described by way of a reference to FIGS. 1A-16C. As shown in FIGS. 1A-1C, an intermediate semiconductor device 100 is illustrated following formation of a gate structure 102 on a semiconductor wafer 104. As described herein, an "intermediate" semiconductor device refers to a semiconductor device in a stage of fabrication prior to a final stage. The semiconductor device 100 extends along a first axis (Y-axis) to define a length, a second axis (X-axis) perpendicular the first axis to define a width, and a third axis (Z-axis) perpendicular to the first and second axes to define a height (i.e., vertical thickness).

The semiconductor wafer 104 is constructed as a semiconductor-on-insulator (SOI) wafer 104. The SOI wafer 104 includes a buried insulator layer 106 such as a buried oxide (BOX) layer 106, for example, interposed between a bulk semiconductor layer 108 and a multi-layer semiconductor fin 110 (see FIGS. 1B and 1C). The bulk semiconductor layer 108 is composed of silicon (Si), for example, and the BOX layer 106 is composed of silicon oxide ($SiO_2$), for example. The BOX layer 106 has vertical thickness ranging from approximately 25 nanometers (nm) to approximately 500 nm.

The multi-layer semiconductor fin 110 is formed as an alternating stack of sacrificial layers 112 and active semiconductor layers 114. A first sacrificial layer 112 is formed directly on an upper surface of the BOX layer 106, and a first active semiconductor layer 114 is formed on an upper surface of the first sacrificial layer 112. The sacrificial layers 112 are composed of a first semiconductor material and the active semiconductor layers 114 are composed of a second semiconductor material different from the first semiconductor material. For example, the sacrificial layers 112 are composed of silicon germanium (SiGe), while the active semiconductor layers 114 are composed of silicon (Si). The sacrificial layers 112 have a vertical thickness ranging, for example, from approximately 3 nm to approximately 10 nm. The active semiconductor layers 114 have a vertical thickness ranging, for example, from approximately 3 nm to approximately 10 nm. Although seven layers are illustrated, it should be appreciated that the multi-layer semiconductor fin 110 can include any number (n) of layers.

Multiple epitaxial growth processes can be performed to form the sacrificial layers 112 and the active semiconductor layers 114. To achieve a SiGe sacrificial layer 112 directly on the upper surface of the BOX layer 106, for example, a SiGe layer is first epitaxially grown on an upper surface of an initial SOI layer (not shown). Thereafter, the SiGe layer is condensed using a thermal oxidation process, for example, that results in the Si in the SiGe layer being consumed (by the oxidation process) while the Ge is driven down into the initial SOI layer (not shown). The thermal oxidation process includes, for example, exposing the initial SiGe layer to a temperature of from about 900° Celsius (C) to about 1,200° C., e.g., about 1,100° C. for a duration from about 5 minutes to about 15 minutes, in $O_2$. In this manner, a single initial SiGe layer 112 is formed on an upper surface of the BOX layer 106 as illustrated in FIGS. 1B and 1C. Subsequent to forming the initial SiGe layer 112, a first active semiconductor layer 114 is epitaxially grown on an upper surface of the initial sacrificial layer 112. Thereafter, additional epitaxial growth processes can be performed to form the multi-layer semiconductor fin 110 as a stack including an alternating series of sacrificial layers 112 and active semiconductor layers 114 as illustrated in FIGS. 1B and 1C.

It should be appreciated that the alternating series of sacrificial layers 112 and active semiconductor layers 114 can be either relaxed or strained. For example, if grown to a certain thickness or with a low Ge concentration, the layers 112 and 114 will be relaxed due to dislocation defects. However, increasing the concentration of Ge, for example, can strain the alternating series of sacrificial layers 112 and active semiconductor layers 114. The active semiconductor layers 114 can also be doped to form a p-type semiconductor device or an n-type semiconductor device. When forming a p-type semiconductor device, the active semiconductor layers 114 can be doped with, for example, phosphorus (P) or arsenic (As). When forming an n-type semiconductor device, the active semiconductor layers 114 can be doped with, for example, boron (B) or gallium (Ga). An annealing process (not shown) can be performed to activate the dopants implanted in the active semiconductor layers 114.

The gate structure 102 is formed on the wafer 104 and wraps around a portion of the multi-layer semiconductor fin 110. The gate structure 102 can be formed using various conventional patterning techniques, which are being omitted from this description for the sake of brevity. The portion of the multi-layer semiconductor fin 110 located beneath the gate structure 102 is designated as the channel region 116 of the semiconductor device 100.

The gate structure 102 includes a sacrificial gate material 118, a hardmask cap 120, and opposing gate spacers 122. The sacrificial gate material 118 can be composed, for example, of polysilicon (PolySi). Although not illustrated, the gate structure 102 can also include a sacrificial dummy gate dielectric interposed between the multi-layer semiconductor fin 110 and the sacrificial gate material 118. The sacrificial dummy gate dielectric can be composed of various oxide materials including, but not limited to, SixOyHz. The height of the sacrificial gate material 118 (including the dummy gate dielectric, if present) can range, for example, from about 20 nanometers (nm) to about 100 nm.

The hardmask cap 120 is formed on an upper surface of the sacrificial gate material 118. The hardmask cap 120 can be composed of various nitride materials including, but not limited to, silicon nitride (SiN). The gate spacers 122 are formed on opposing outer sidewalls of the sacrificial gate material 118 and the hardmask cap 120. The gate spacers 122 can be composed of SiBCN, which allows the multi-layer semiconductor fin 110 to be etched with respect to the gate structure 102 as described in greater detail below. SiBCN also has a dielectric constant (k) that is less than conventional SiN spacers. Accordingly, the overall capacitance of the gate structure 102 can be reduced compared to conventional gate structures.

Figure 2A:
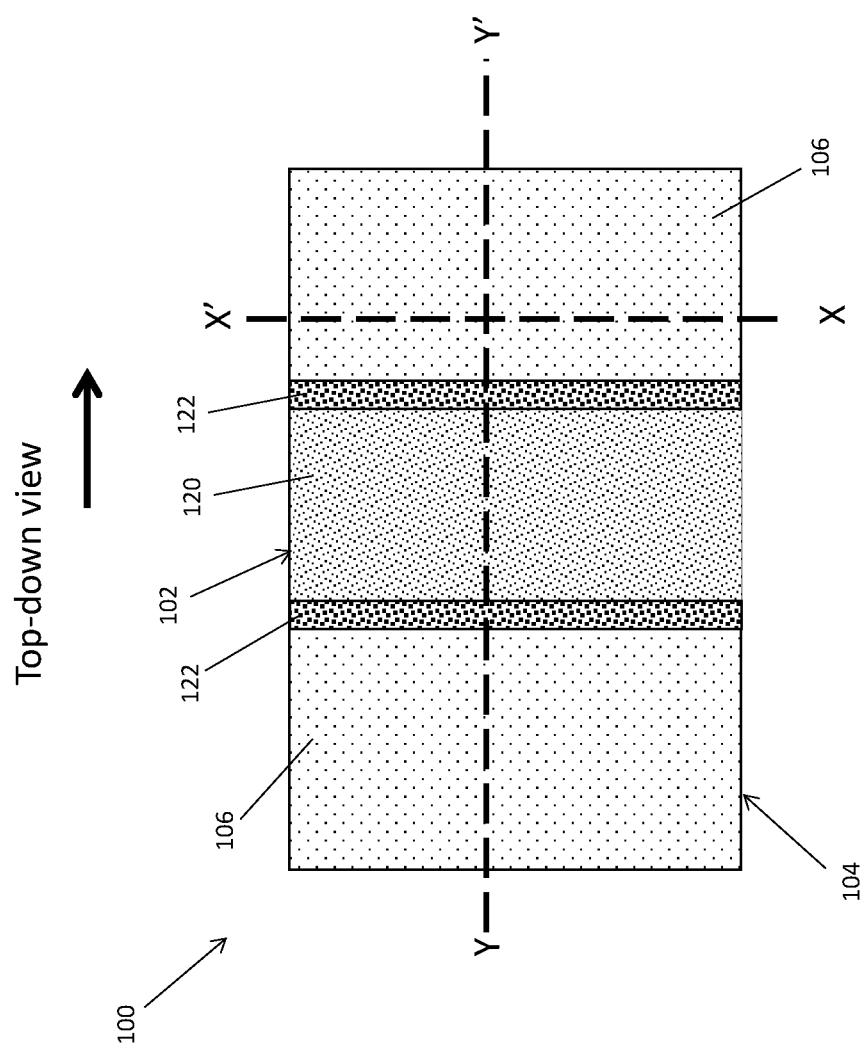
FIG. 2A depicts a top view of the semiconductor device following an etching process.
Figure 2C:
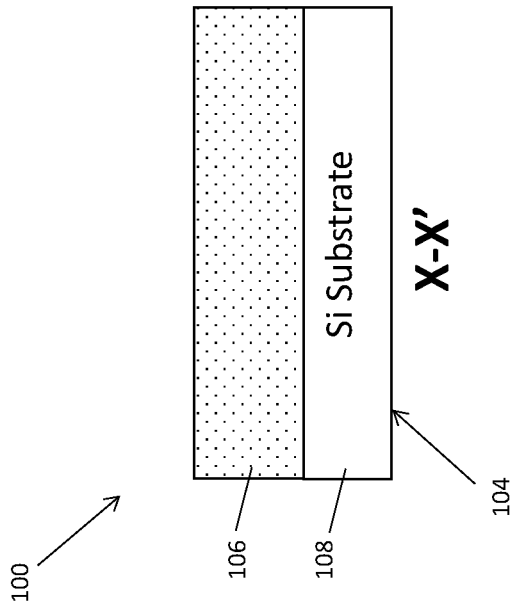
FIG. 2C depicts the semiconductor device of FIG. 2A taken along line X-X'.
Figure 2B:
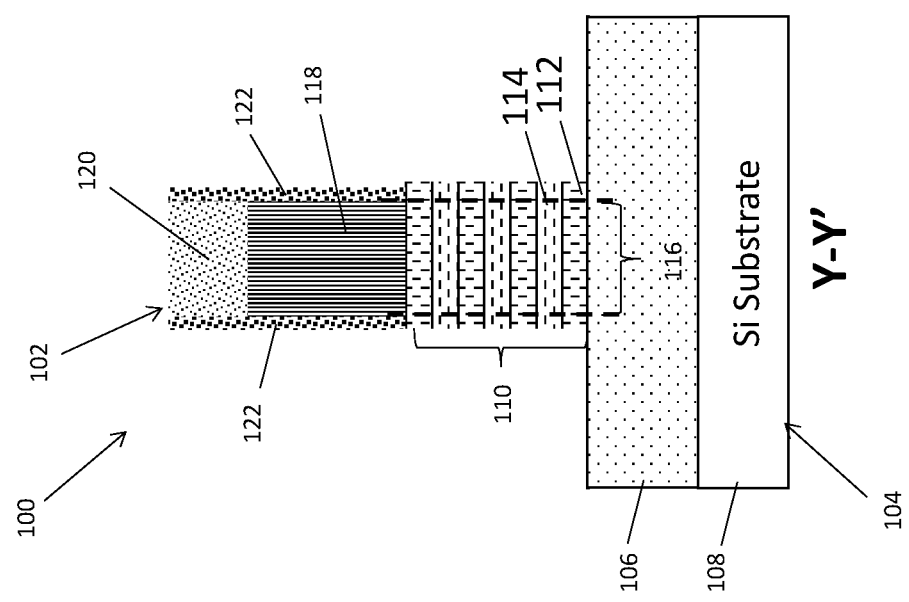
FIG. 2B depicts the semiconductor device of FIG. 2A taken along line Y-Y.

Referring now to FIGS. 2A-2C, the semiconductor device 100 is illustrated following a fin etching process to expose portions of the BOX layer 106 located in the S/D regions. The fin etching process is achieved using a directional reactive ion etch (RIE) process, which is capable of removing portions of the sacrificial layers 112 and active semiconductor layers 114 not covered by the gate structure 102. The RIE can use a boron-based chemistry or a chlorine-based chemistry, for example, which selectively recesses the exposed portions sacrificial layers 112 and the active semiconductor layers 114 (i.e. the portions not by the gate structure 102) without attacking the gate structure 102 or the BOX layer 106. Thus, the gate structure 102 serves as a mask such that the remaining nanosheet stack 110 is retained in the channel region 116.

Figure 3:
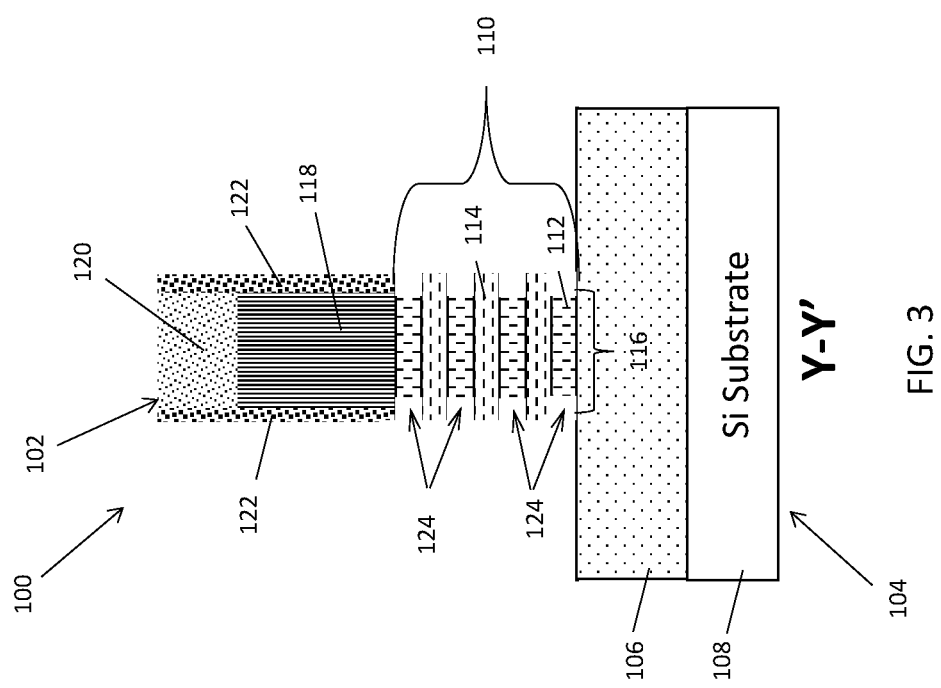
FIG. 3 depicts the semiconductor device following a sacrificial nanosheet etching process.

Turning to FIG. 3, the semiconductor device 100 is illustrated following a lateral etching process to remove a portion of the sacrificial layers 112. The lateral etching process can be performed using a wet isotopic etching process or a dry isotropic etching process. When using the wet isotropic etching process, for example, a heated hydrochloric acid (HCL), selectively attacks the sacrificial layers 112 while preserving the active semiconductor layers 114, BOX layer 106, and gate structure 102. In this manner, cavities 124 are formed in the sacrificial layers 112. The lateral depth (i.e., extending along the Y-axis and into the sacrificial layers 112) of the cavities 124 can range, for example, from about 3 nm to about 8 nm.

Figure 4:
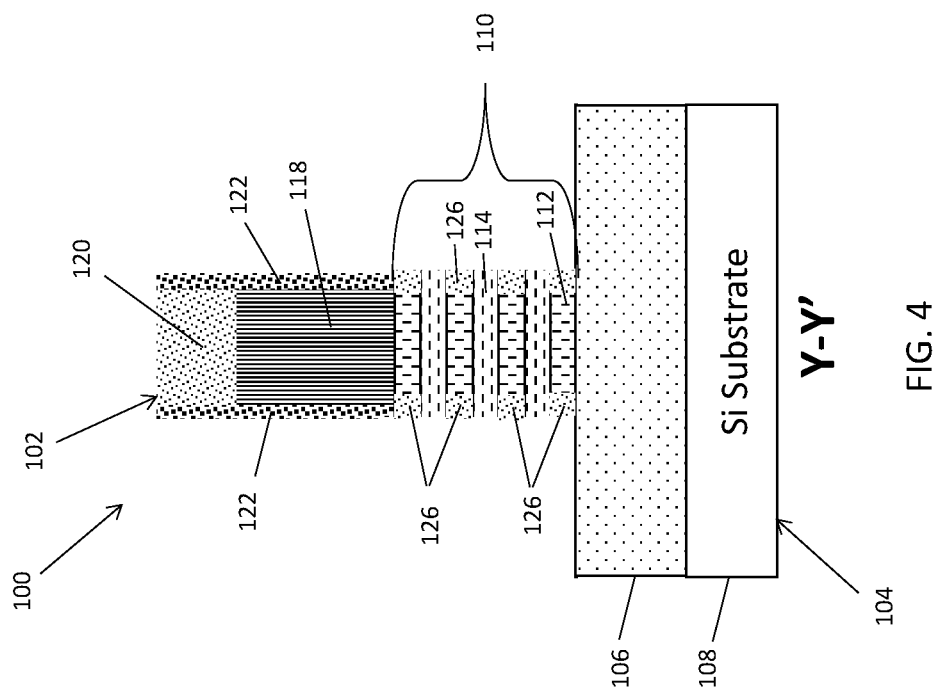
FIG. 4 depicts the semiconductor device following the formation of inner spacers.

Turning to FIG. 4, the semiconductor device 100 is illustrated after filling the cavities 124 (see FIG. 3) with a dielectric material to from inner spacers 126. The dielectric material can include SiN, for example, and can be deposited according to a conformal deposition processes (not shown) that applies a conformal dielectric layer along the outer sides of the nanosheet stack 110, and the upper surface of the BOX layer 106. An atomic layer deposition (ALD) process can be performed to achieve the conformal deposition of the dielectric material. In this manner, the dielectric material fills the previously formed cavities to form inner spacers 126.

A subsequent wet etching process (not shown) that etches the dielectric material can be performed to remove any excess dielectric material. The etch can be a selective etch having a chemistry that etches the dielectric material without attacking the gate structure 102 or BOX layer 106, or a timed wet etch. In one or more embodiments of the invention, the thickness of the dielectric material applied to the sidewalls of the nanosheet stack 110 can be larger than the final thickness desired to fill the cavities 124. The increased thickness provides a buffer so that the subsequent wet etching process can remove excess dielectric material from the sidewalls of the nanosheet stack 110 without over-etched the inner spacers 126. The subsequent wet etching process can also be timed so that excess dielectric material is removed from the gate structure 102 and the BOX layer 106 without substantially recessing the inner spacers. Accordingly, the outer surface of the inner spacers 126 are flush (i.e., co-planar) with respect to the outer surface of the active semiconductor layers 114. In one or more embodiments of the invention, each active semiconductor layer 114 is interposed between an upper set of opposing inner spacers 126 and a lower set of opposing spacers 126 as further illustrated in FIG. 4.

Figure 5A:
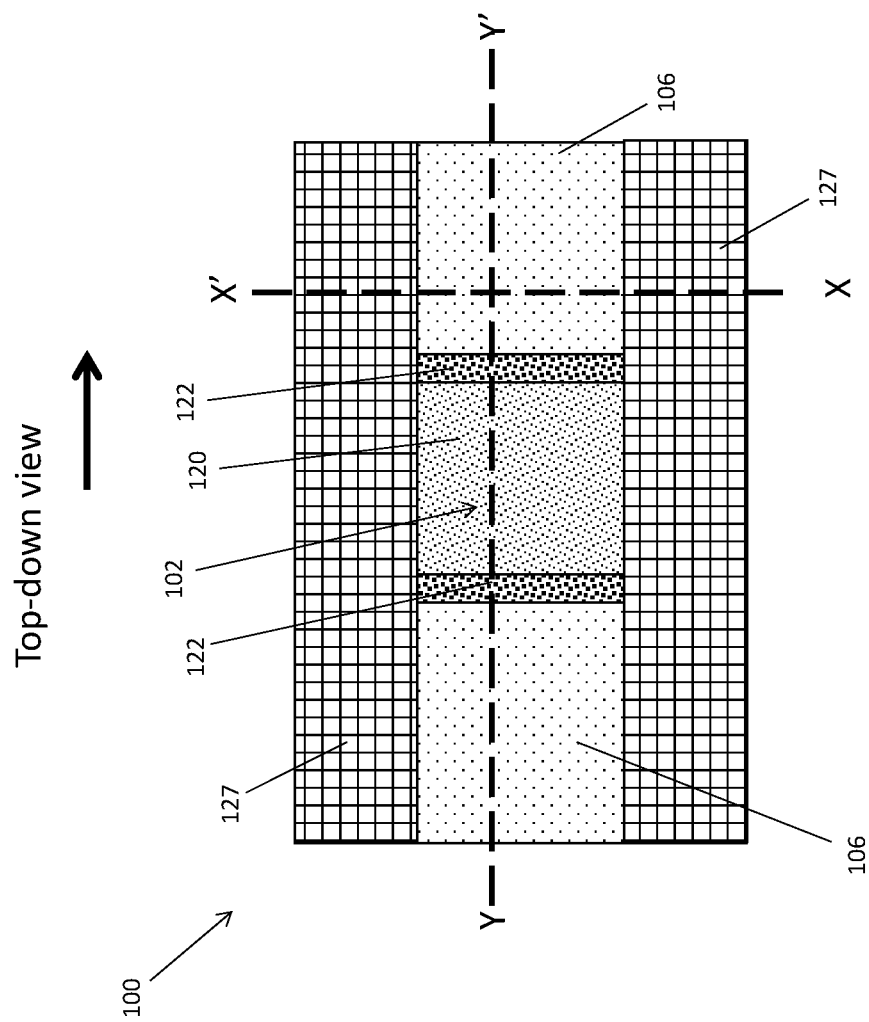
FIG. 5A depicts a top view of the semiconductor device after patterning a photoresist mask layer.
Figure 5C:
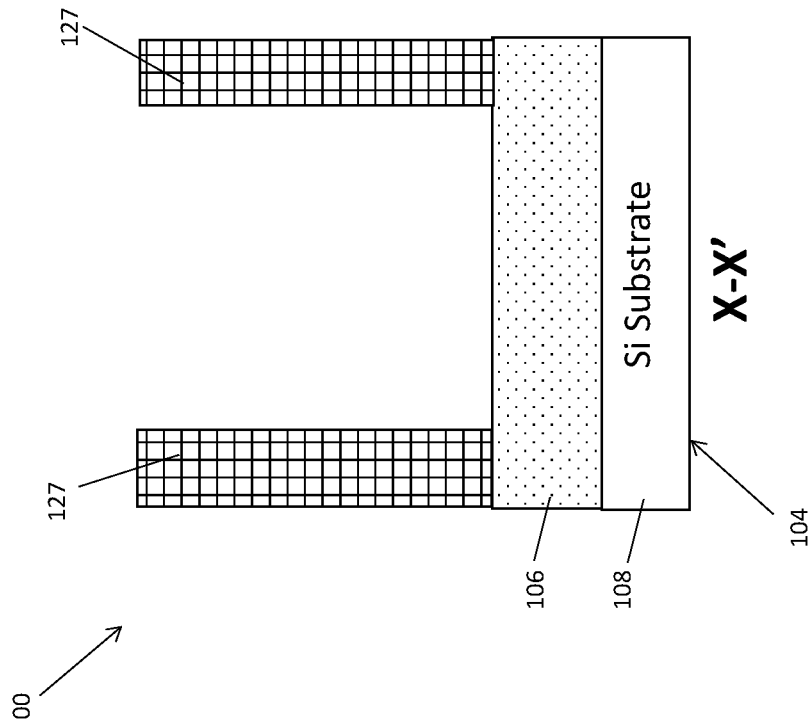
FIG. 5C depicts the semiconductor device of FIG. 5A taken along line X-X'.
Figure 5B:
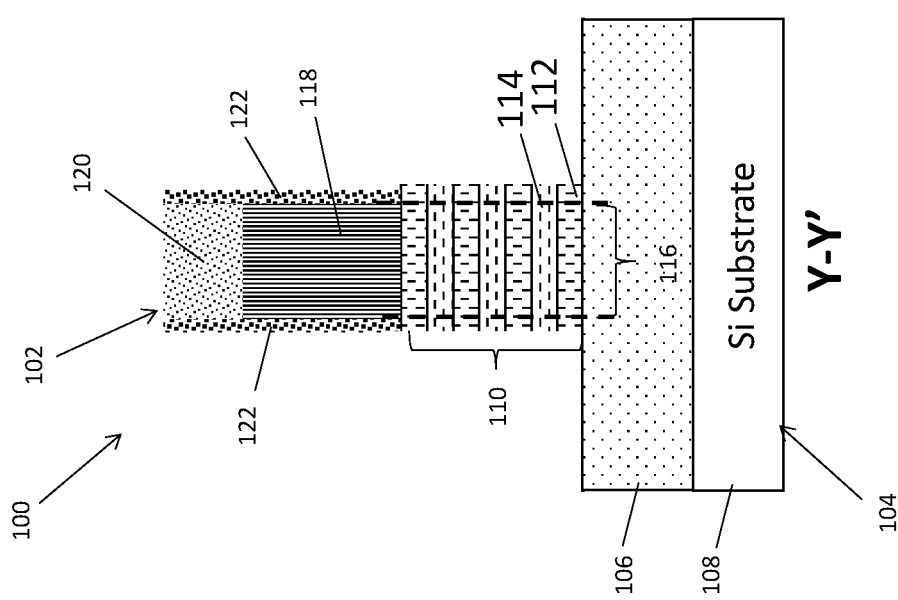
FIG. 5B depicts the semiconductor device of FIG. 5A taken along line Y-Y'.

With reference now to FIGS. 5A-5C, the semiconductor device 100 is illustrated after depositing a photoresist layer 127 on an upper surface of the BOX layer 106, and then and then performing a photolithograph recess process to transfer the pattern through the photoresist layer 127 while stopping on the upper surface of the BOX layer 106. In at least one non-limiting embodiment of the invention, the width of opening along X direction is wider than width of the S/D epitaxial structure formed in the downstream process.

Referring to FIGS. 6A-6B, a S/D trench 128 is formed in the BOX layer 106 located in each S/D region. The S/D trenches 128 can be formed using a dry etching process that selectively attacks the material (e.g., SiO2) of the BOX layer 106 without attacking the gate structure 102, the sacrificial layers 112, the active semiconductor layers 114, and the inner spacers 128. A RIE process, for example, can be performed to transfer the pattern into the BOX layer 106 to form the S/D trench 128. The chemistry used in the dry etching process includes, but is not limited to, hexafluoropropene (C3F6). The vertical depth (i.e., extending along the Z-axis) of the S/D trenches 128 can range, for example, from about 4 nm to about 10 nm.

Figure 7A:
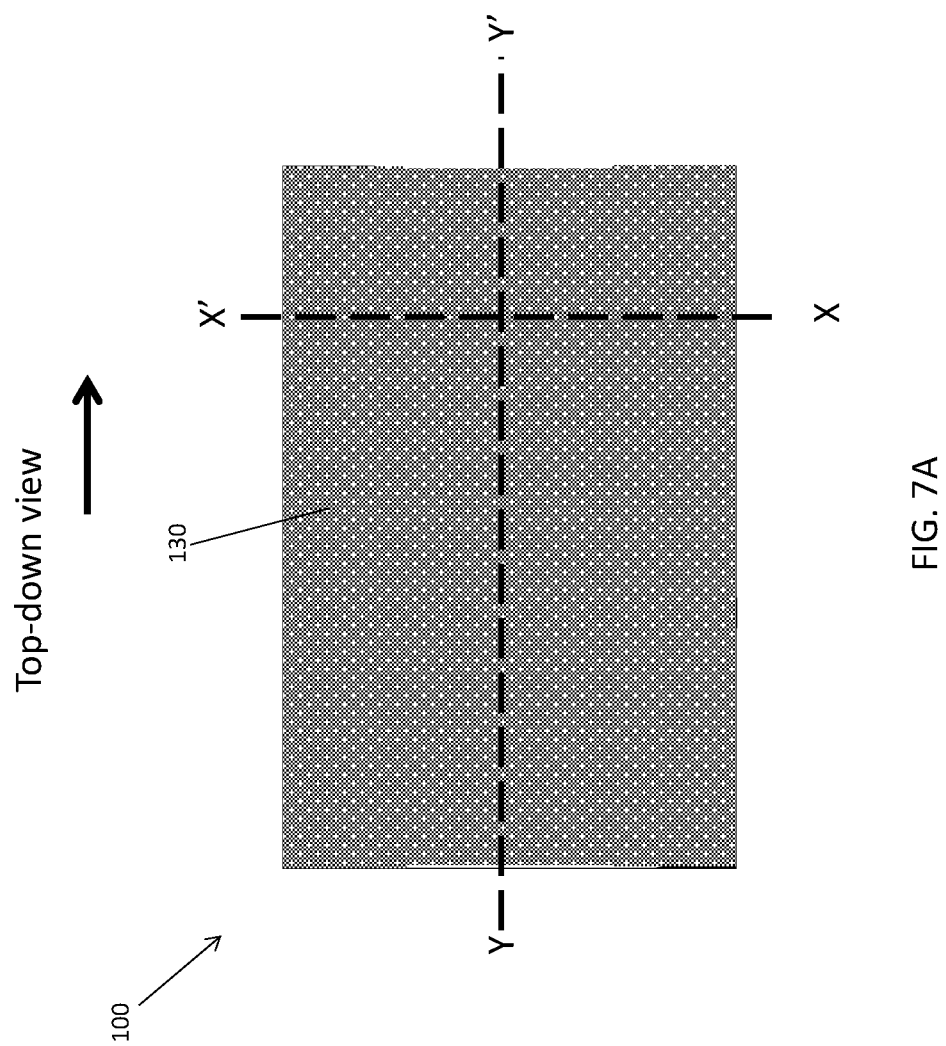
FIG. 7A depicts a top view of the semiconductor device after filling the trenches with a sacrificial material.
Figure 7C:
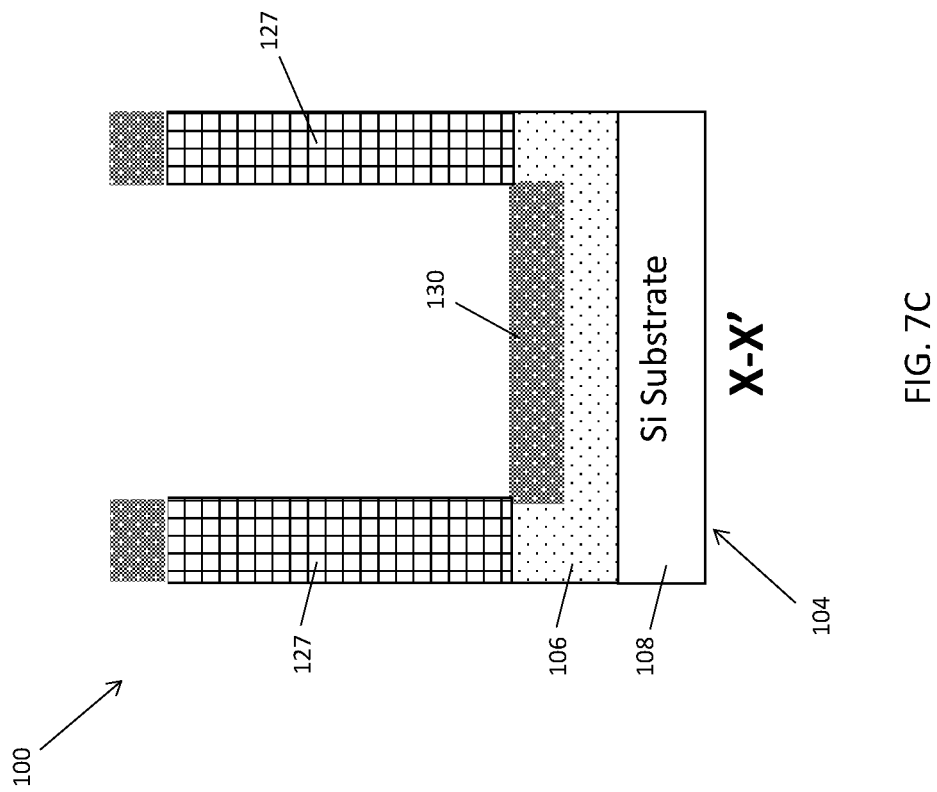
FIG. 7C depicts the semiconductor device of FIG. 7A taken along line X-X'.
Figure 7B:
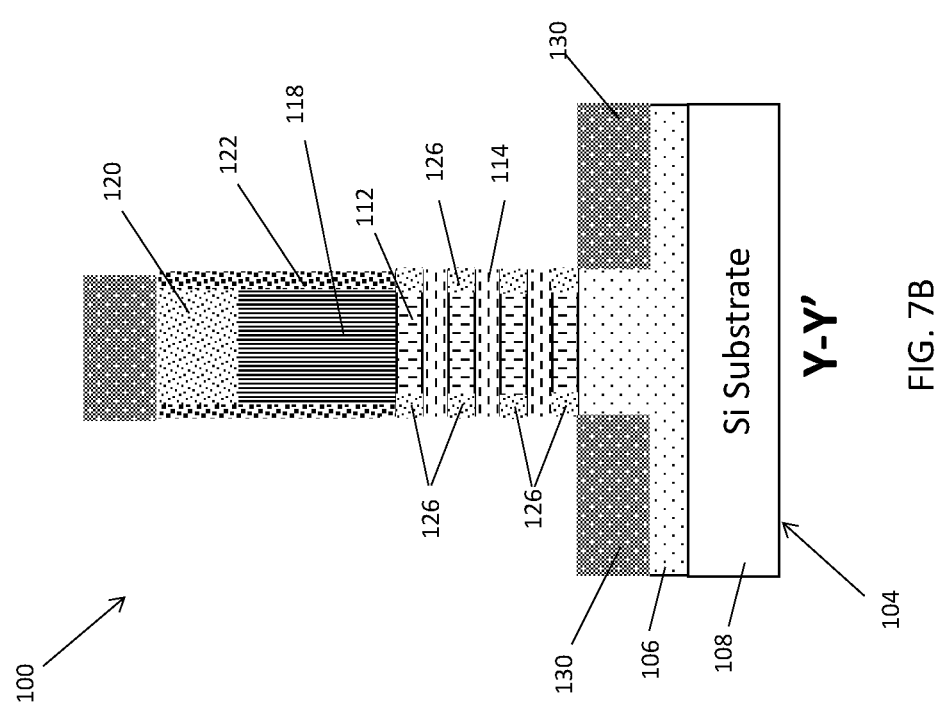
FIG. 7B depicts the semiconductor device of FIG. 7A taken along line Y-Y'.

Turning to FIGS. 7A-7C, the semiconductor device 100 is illustrated after filling the S/D trenches 128 with a sacrificial material to form sacrificial regions 130. The sacrificial material can be composed of a material that promotes epitaxial growth therefrom, while facilitating a subsequent etching process capable of etching the sacrificial material without attacking the grown epi material and the material (e.g., SiO2) of the BOX layer 106. In one or more embodiments of the invention, the sacrificial material is composed of, for example, silicon carbon oxide (SiCO).

A directional deposition process (i.e., along the Z-axis) such as a physical vapor deposition (PVD) process or high-density plasma (HDP) deposition process or gas cluster ion beam (GCM) deposition, for example, can be performed to deposit the sacrificial material 130 in the S/D trenches 128 without depositing the sacrificial material on the sidewalls of the nanosheet stack 110 (i.e. the sidewalls of the inner spacers 126 and the active semiconductor layers 114). The remaining photoresist material 127 can then be removed from the upper surface of the BOX layer 106 after forming the S/D trench 128 after forming the sacrificial regions 130. Because the S/D trenches 128 were formed by utilizing the gate structure 102 as a mask, the sacrificial regions 130 are effectively self-aligned at a desired location in the BOX layer 106 and are thus properly aligned with respect to the sides of gate structure 102 and the nanosheet stack 110 (e.g., the opposing ends of the nanosheets 112 and 114).

In one or more embodiments of the invention, the height (e.g., along the Z-axis) of the deposited sacrificial regions 130 extend no further than the upper surface of the preserved portion of the BOX layer 106 located beneath the nanosheet stack 110 (i.e., beneath the sacrificial layer 112). In other embodiments of the invention, the upper surface of the deposited sacrificial regions 130 is flush (i.e., co-planar) with respect to the upper surface of the preserved portion of the BOX layer 106 located beneath the nanosheet stack 110. In this manner, the dimensions of the sacrificial regions 130 can assist in defining a portion of the all-around S/D contact (not shown in FIGS. 7A-7C) as discussed in greater detail below.

Figure 8A:
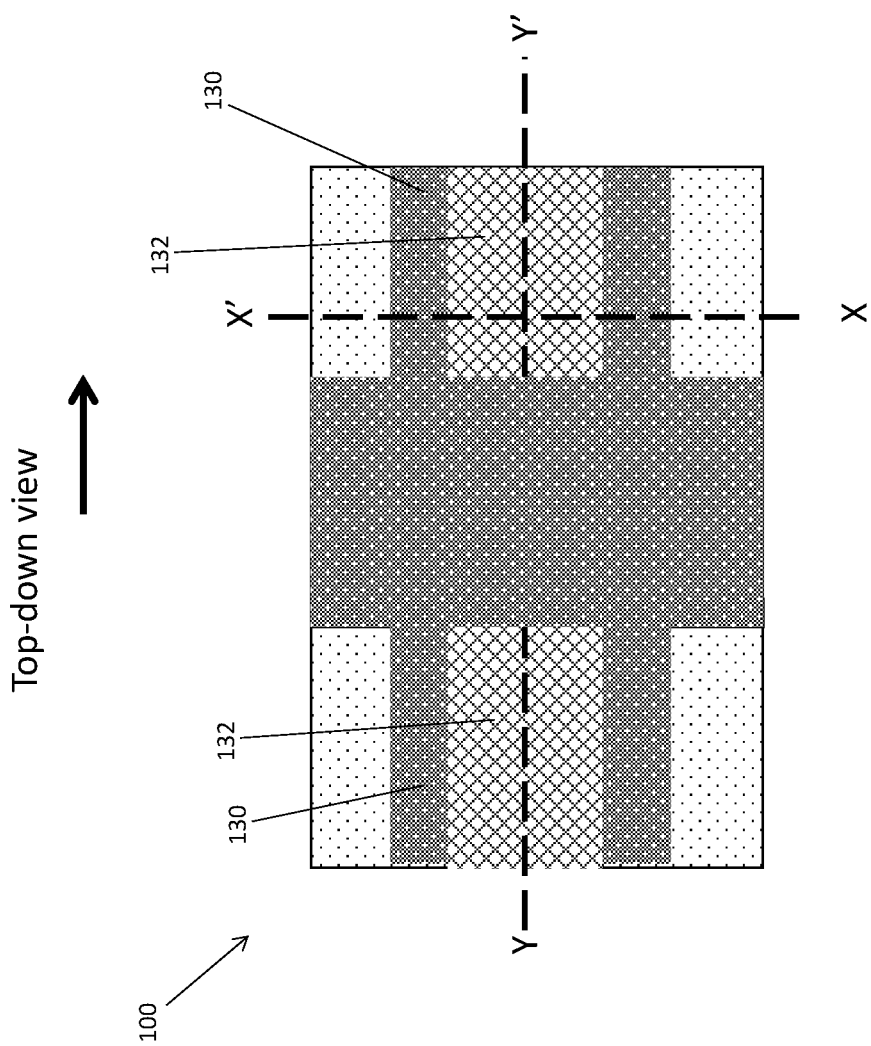
FIG. 8A depicts a top view of the semiconductor device after epitaxially growing source/drain contacts on the sacrificial material.
Figure 8C:
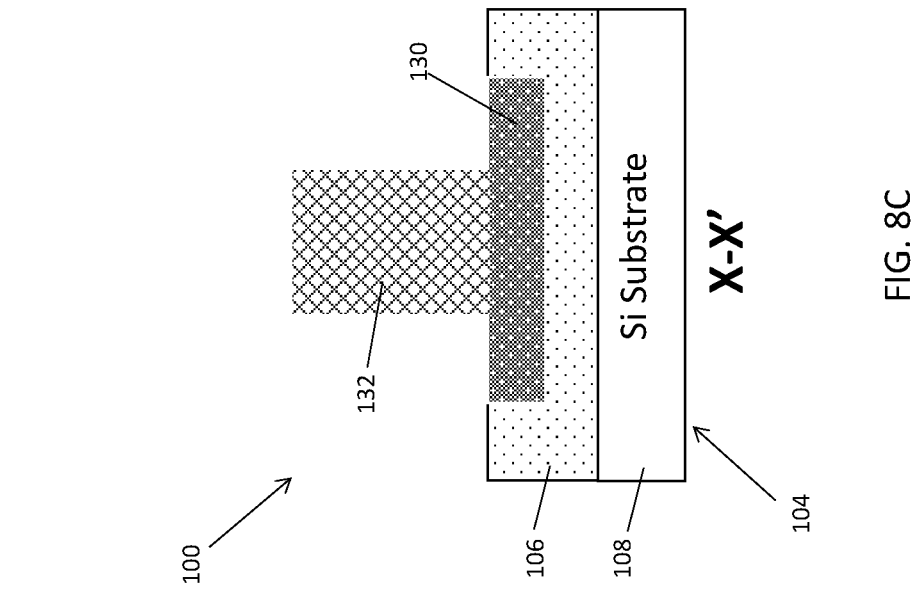
FIG. 8C depicts the semiconductor device of FIG. 8A taken along line X-X'.
Figure 8B:
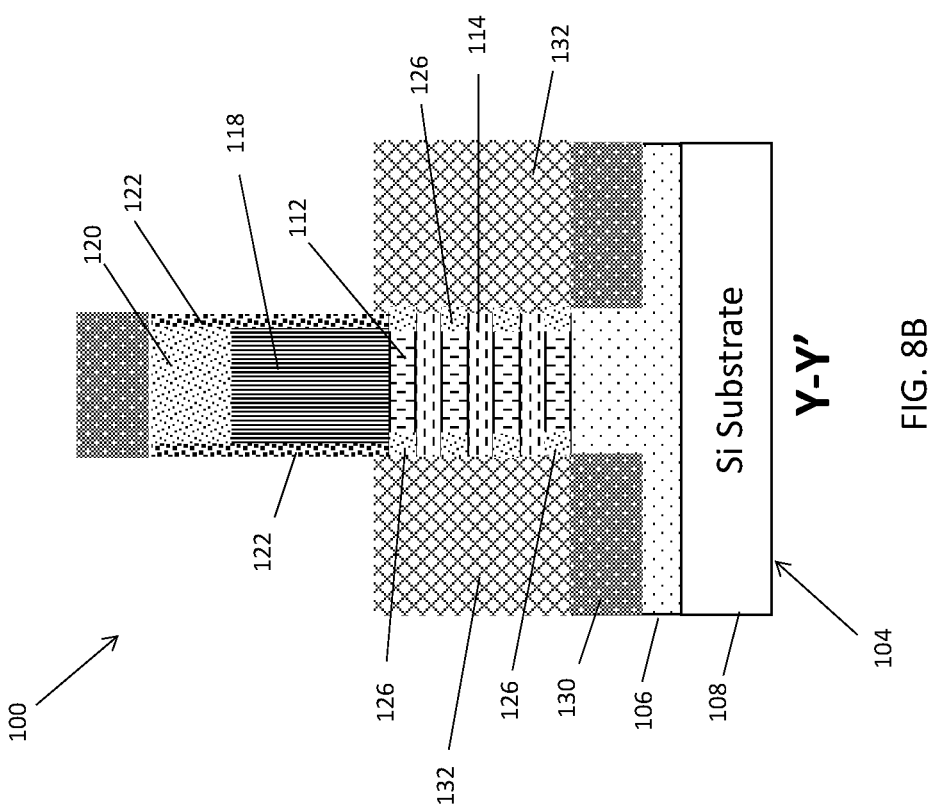
FIG. 8B depicts the semiconductor device of FIG. 8A taken along line Y-Y'.

Referring now to FIGS. 8A-8C, the semiconductor device 100 is illustrated following an epitaxy process. The epitaxy process utilizes the sacrificial regions 130 to grow S/D epitaxy (epi) structure 132 therefrom. Various well-known epitaxy processes can be used to grow a highly-conductive material such as Si or germanium (Ge), for example, from the upper surface of the sacrificial regions 130. The epitaxy process used to grow the S/D epi 132 can be carried out using various epitaxy techniques including, but not limited to, vapor phase epitaxy (VPE), molecular beam epitaxy (MBE) or liquid phase epitaxy (LPE) with a gaseous or liquid precursor, such as, for example, silicon tetrachloride. The S/D epi 132 can also be doped. For example, when fabricating a p-type semiconductor device (e.g., a PFET), the epitaxial grown material can be composed of a SiGe material doped with boron (B). When fabricating an n-type semiconductor device (e.g., a NFET), the epitaxial grown material can be composed of a Si material doped with phosphorus (P) or arsenic (As).

In one or more embodiments of the invention, the epitaxy process can be performed so that the upper surface of the S/D epi 132 is flush (i.e., co-planar) with respect to the interface between the sacrificial gate material 118 and the sacrificial layer 112. In other embodiments of the invention, the upper surface of the S/D epi 132 can extend beyond the interface between the sacrificial gate material 118 and the sacrificial layer 112. Although the S/D contacts 132 are illustrated as having a uniform square shape, other shapes or profiles can be envisioned. In one or more embodiments, an anneal process can be performed to active any dopants implanted in the S/D epi.

Turning to FIGS. 9A-9C, the semiconductor device 100 is illustrated after depositing an inter-layer dielectric (ILD) 134 to cover the S/D epi 132. The ILD 134 is composed of a flowable oxide material such as polymer hydrogen silsesquioxane (HSQ) solution in methyl isobutyl ketone (MIBK), for example, and can be deposited an upper surface of the BOX layer 106 to completely cover or encapsulate the S/D epi 132. In one more embodiments of the invention, a subsequent planarization process (not shown) can be performed. The planarization process can be selective to the ILD 134 so that process stops on the upper surface of the gate cap 120 and spacers 122. In this manner, the upper surface of the ILD 134 can be flush (i.e., co-planar) with respect to the upper surface of the gate cap 120 and the spacers 122 as further illustrated in FIG. 9B.

Figure 10:
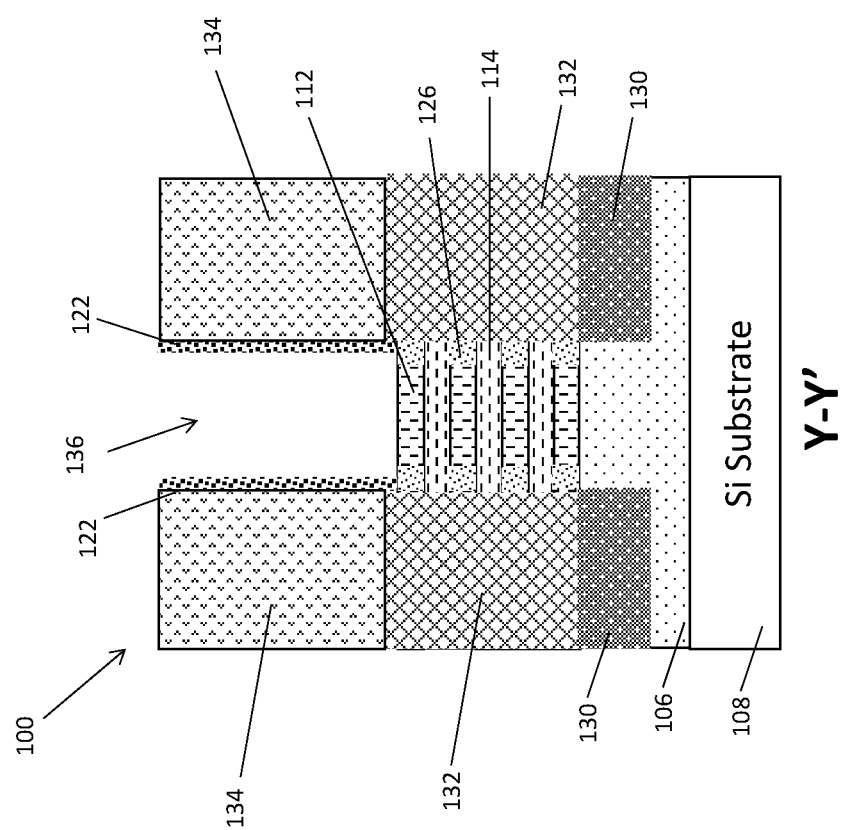
FIG. 10 depicts the semiconductor device after removing the gate cap.

Referring now to FIG. 10, the semiconductor device 100 is illustrated following a removal of the gate cap 120 and the sacrificial gate material 118. Accordingly, a gate trench 136 is formed, which exposes the nanosheet stack 110 (i.e., the sacrificial layers 112 and the active semiconductor layers 114). A directional RIE process can be performed to form the gate trench 136. Although not illustrated, it can be appreciated that a first direction RIE process can be performed to remove the gate cap 120 and expose the underlying nanosheet stack 110, while a second direction RIE process can be used to remove the sacrificial gate material 118.

Figure 11:
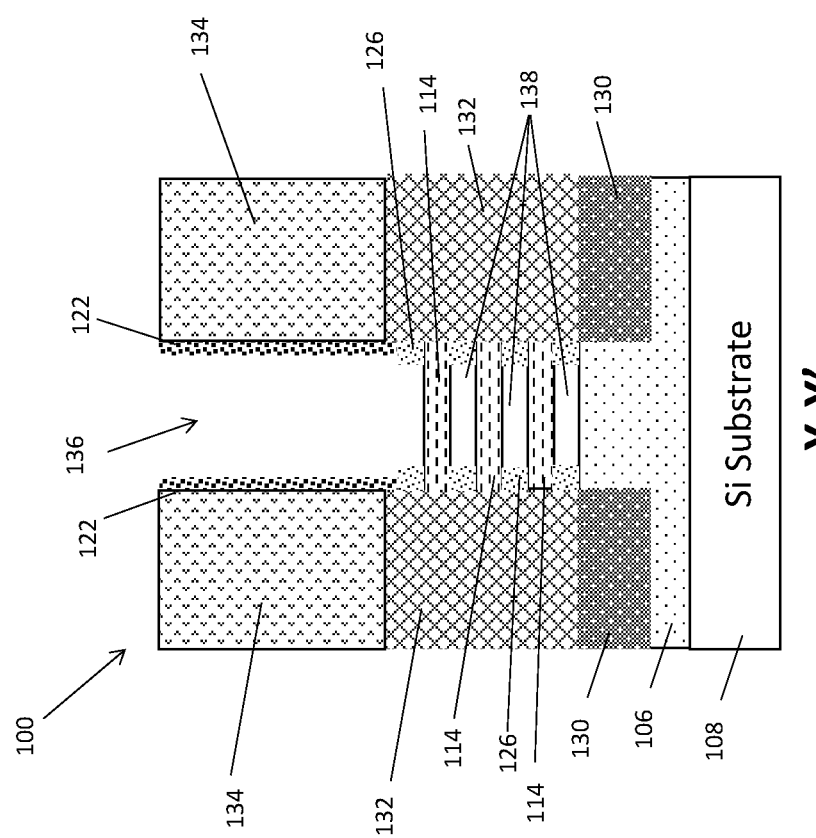
FIG. 11 depicts the semiconductor device after removing the sacrificial nanosheets.

Turning to FIG. 11, the semiconductor device 100 is illustrated following a selective etching process that removes the sacrificial layers 112 while preserving the inner spacers 126 and the active semiconductor layers 114. Accordingly, the active semiconductor layers 114 are released from the previously existing nanosheet stack 110 and become suspended above the BOX layer 106, while voids 138 are formed between each suspended active semiconductor layer 114. The voids 138 also expose the inner walls of the inner spacers 126 and a portion of the BOX layer 106 as further illustrated in FIG. 11.

Figure 12:
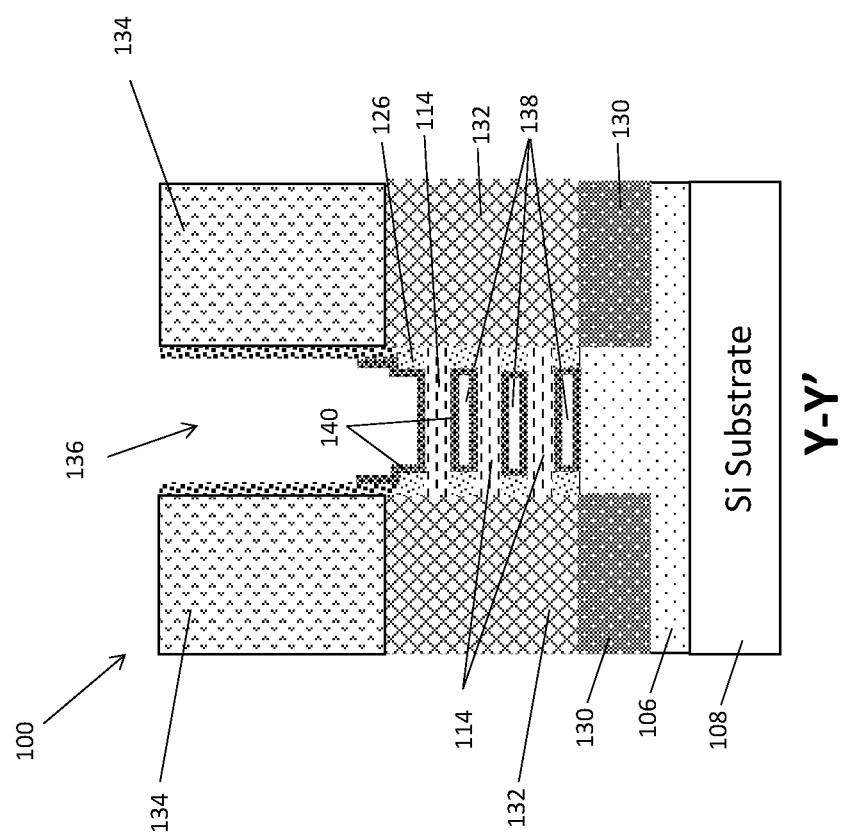
FIG. 12 depicts the semiconductor device after depositing a gate dielectric layer.

Turning to FIG. 12, the semiconductor device 100 is illustrated following deposition of a gate dielectric layer 140. The gate dielectric 140 can be composed of various high dielectric (high-k) materials (e.g., a k value greater than 10) including, but not limited to, hafnium oxide (HfO2), and can be deposited according to a conformal deposition process such as an ALD process, for example. In this manner, the exterior surface of each active semiconductor layer 114 is covered by the gate dielectric layer 140.

Figure 13:
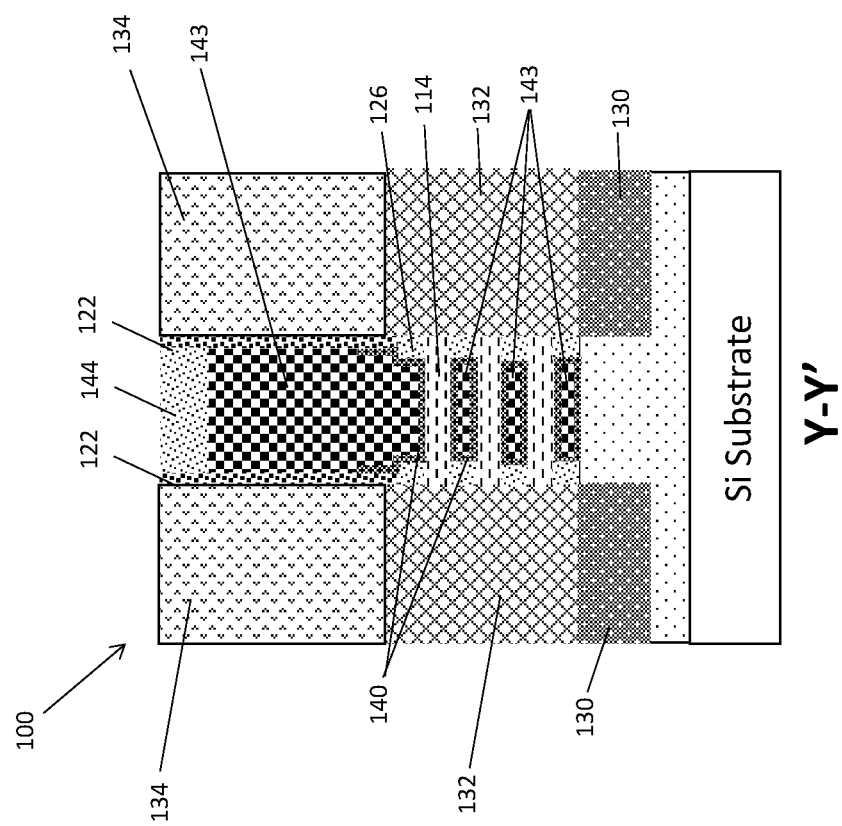
FIG. 13 depicts the semiconductor device after forming a replacement gate contact.

Referring to FIG. 13, the semiconductor device 100 is illustrated following formation of a gate replacement structure 142 in the gate trench 136. The gate replacement structure 142 includes an electrically conductive material 143 composed of tungsten (W) or aluminum (Al), for example, which can be deposited in the gate trench 136 according to a chemical vapor deposition (CVD) process. Although not illustrated, one or more work function metal layers can be deposited on outside surfaces of the gate dielectric layer 140 prior to depositing the electrically conductive gate material 143. The work function metal layers can include layers of titanium nitride or TiAlC (depending upon the type of transistor device being manufactured). Accordingly, the work function metal layer and/or the electrically conductive gate material 143 completely surrounds the exposed portions of the active semiconductor layers 114 (i.e., the released nanosheets 114).

One or more CMP processes (not shown) can be performed to remove excess portions of the gate material deposited outside of the gate cavity. In addition, one or more etching processes (not shown) can be performed to remove an upper portion of the replacement the gate material 143 in order to form a gate cap layer 144 as further illustrated in FIG. 13. The gate cap layer 144 can be composed of silicon nitride (SiN), for example, and can be deposited to over-fill the recess formed in the gate cavity above the replacement gate structure 142. Thereafter, a CMP process can be performed to remove excess portions of the gate cap 144 positioned above the surface of the ILD 134. In one or more embodiments of the invention, the gate cap 144 is capable of protecting the underlying gate materials during subsequent processing operations.

Figure 14A:
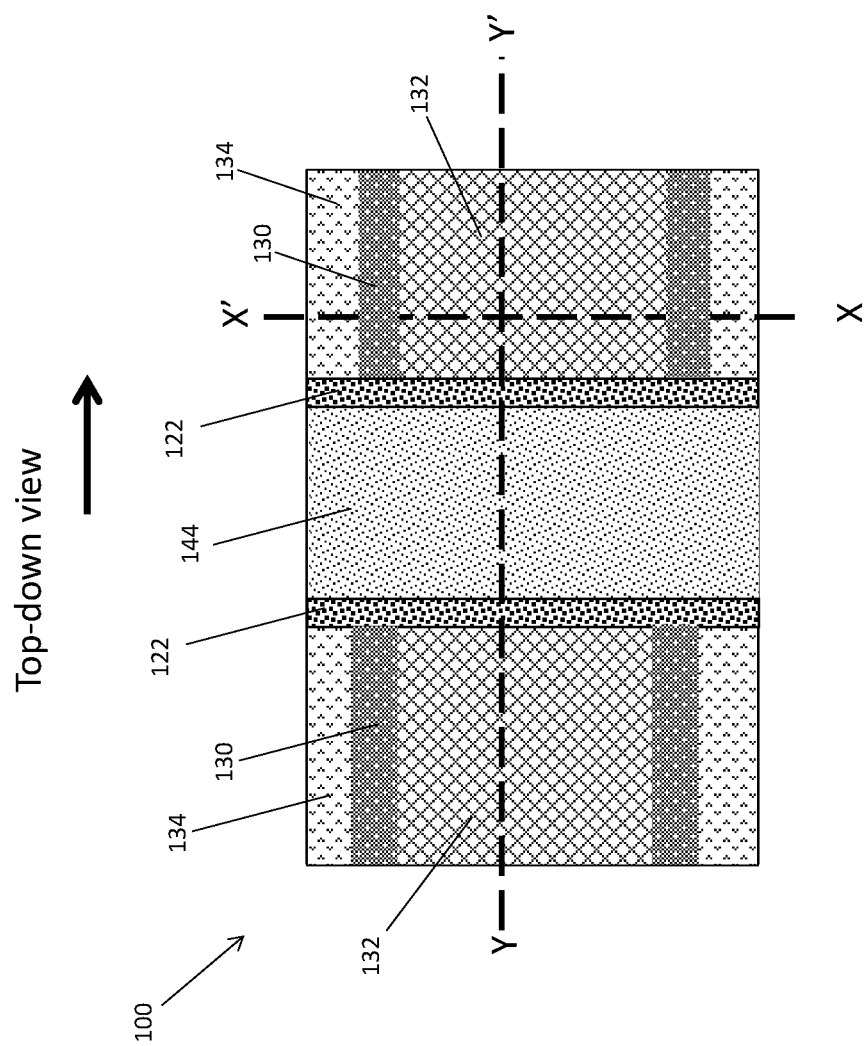
FIG. 14A depicts a top view of the semiconductor device after removing the ILD.
Figure 14C:
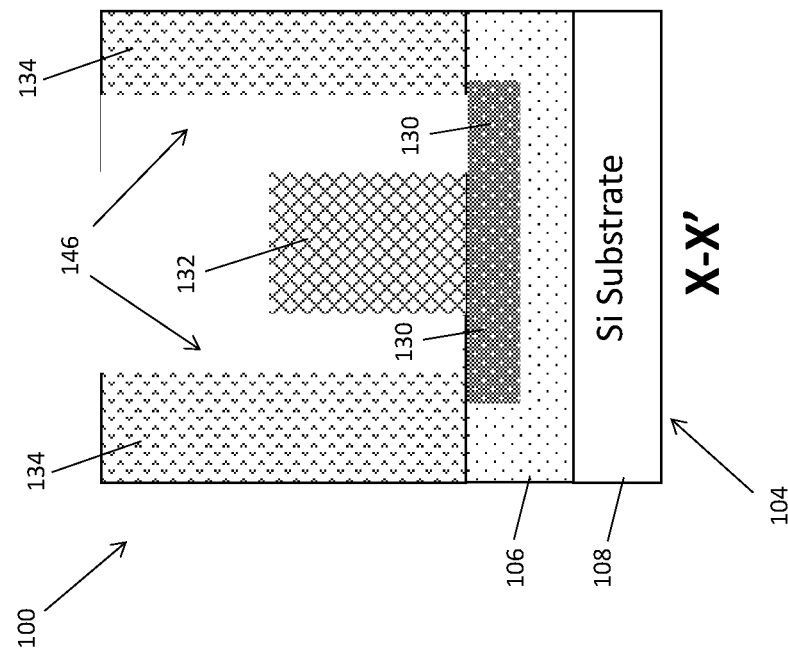
FIG. 14C depicts the semiconductor device of FIG. 14A taken along line X-X'.
Figure 14B:
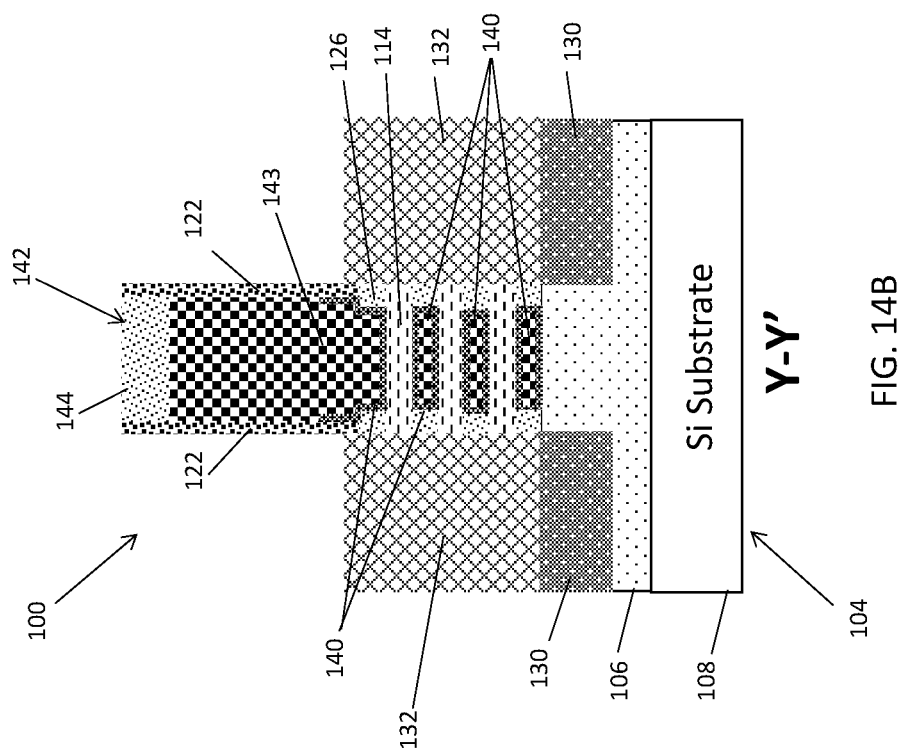
FIG. 14B depicts the semiconductor device of FIG. 14A taken along line Y-Y'.

Turning now to FIGS. 14A-14C, the semiconductor device 100 is illustrated after removing a portion of the ILD 134. In one or more embodiments of the invention, an organic planarizing layer (OPL) mask (not shown) can be formed on the ILD 134 and then patterned. Thereafter, a RIE process selective to the ILD 134 is performed so that the ILD 134 is partially removed without attacking the underlying S/D epi 132, sacrificial regions 130, and replacement gate structure 142. Accordingly, ILD trenches 146 are formed between the remaining ILD 134 and a respective S/D epi 132, thereby exposing the sacrificial layer as further illustrated in FIG. 14C. The ILD trenches 146 have a width (i.e., extending along the X-axis) ranging, for example, from about 5 nm to about 15 nm. The width of the ILD trenches 146 can serve to define side portions of the all-around S/D contact (not shown in FIGS. 14A-14C) as described in greater detail below.

Figure 15C:
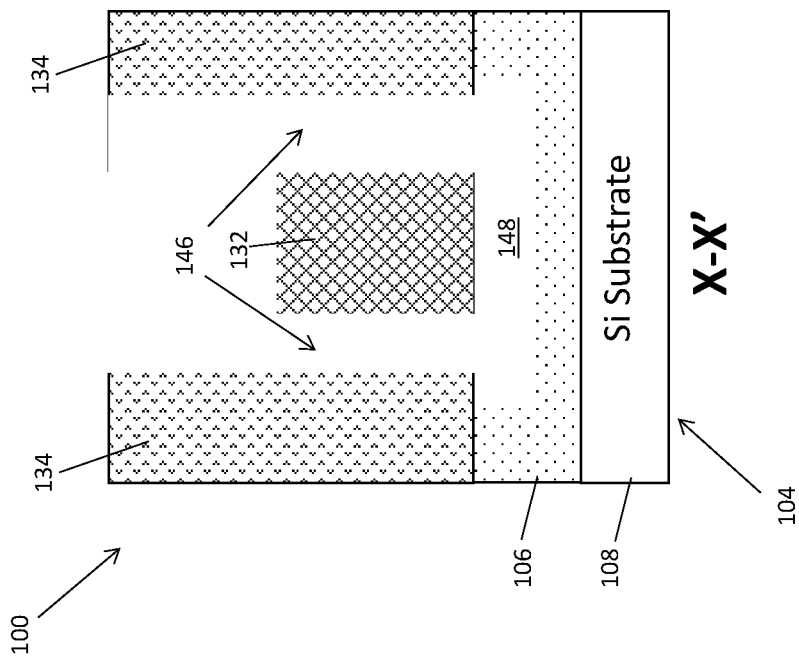
FIG. 15C depicts the semiconductor device of FIG. 15A taken along line X-X'.
Figure 15B:
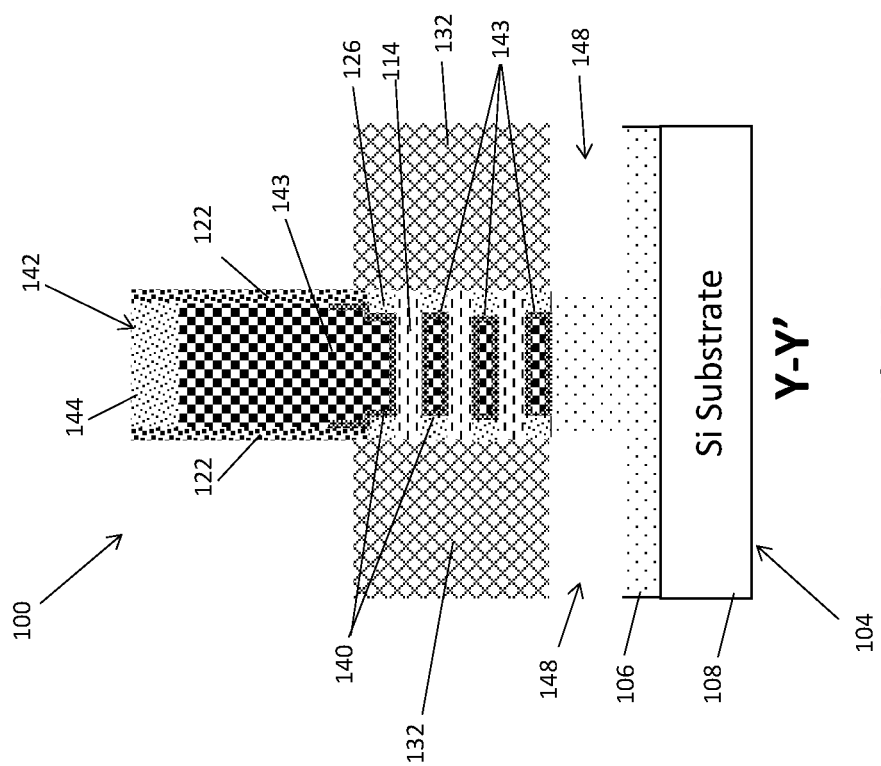
FIG. 15B depicts the semiconductor device of FIG. 15A taken along line Y-Y'.

Referring to FIGS. 15A-15C, the semiconductor device 100 is illustrated following a selective etching process that removes the sacrificial regions 130. The etching process can be performed using a dry etching chemistry or a wet etching chemistry that selectively attacks the sacrificial regions 130 without attacking or substantially attacking the S/D epi 132 and the BOX layer 106. In this manner, a S/D trench 148 is formed beneath the epi S/D contacts 132. The S/D trench 148 can have a vertical height ranging, for example, from about 5 nm to about 15 nm Accordingly, the S/D trench 148 can serve to define a lower contact portion of the all-around S/D contact (not shown in FIGS. 15A-15C) as described in greater detail below.

With reference now to FIGS. 16A-16C, the semiconductor device 100 is illustrated after filing the ILD trenches 146 and the S/D trench 148 with an electrically conductive S/D contact material to form an all-around S/D contact 150. The S/D contact material 150 can be composed of various metal materials including, but not limited to, tungsten (W), aluminum (Al), and copper (Cu). As illustrated in FIG. 16C, for example, the all-around S/D contact 150 has an electrically conductive external portion that includes opposing side portions 152 extending vertically between an upper contact portion 154 and a lower contact portion 156. Accordingly, the all-around S/D contact 150 completely surrounds and encapsulates the S/D epi 132 thereby reducing the overall resistance in the S/D regions of the semiconductor device 100. In addition, because the initial sacrificial regions 130 were self-aligned with respect to the nanosheet stack, the resulting upper portion 154, source/drain epi 132, and the lower portion 156 are aligned vertically with respect to one another along their centers, i.e., along center axis A-A' as further illustrated in FIGS. 16B and 16C.

Figure 17A:
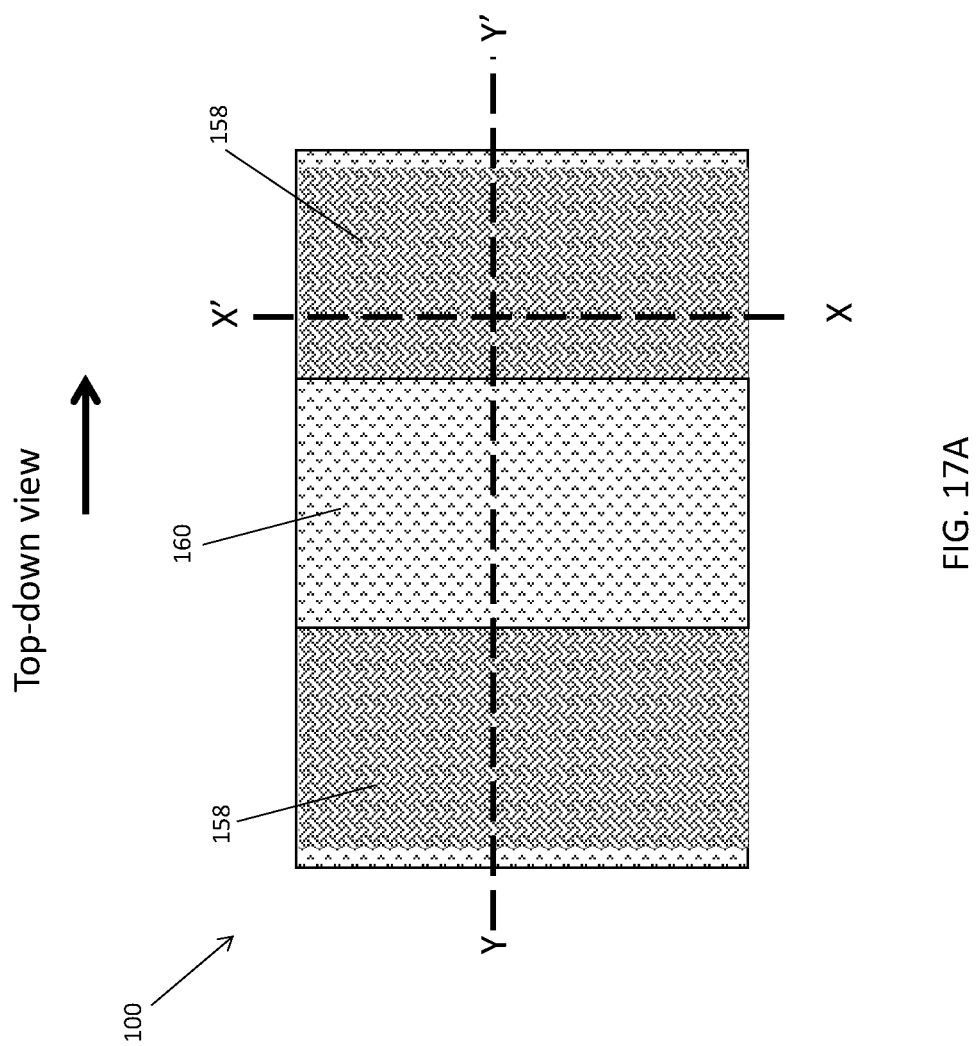
FIG. 17A depicts a top view of the semiconductor device following formation of source/drain vias on the all-around source/drain contacts.
Figure 17C:
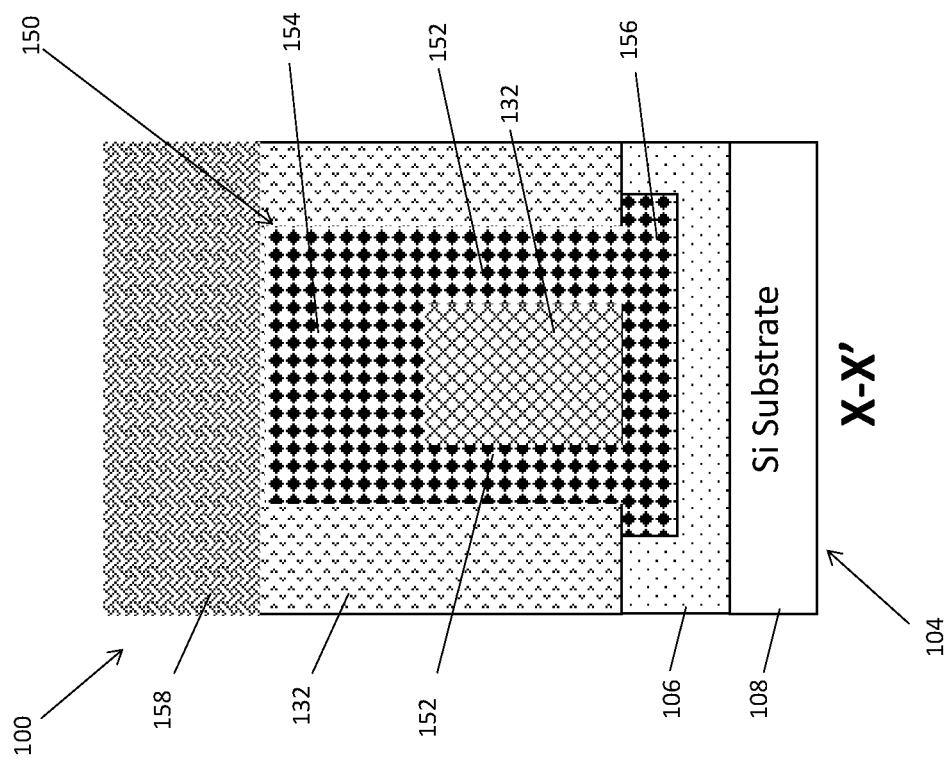
FIG. 17C depicts the semiconductor device of FIG. 17A taken along line X-X'.
Figure 17B:
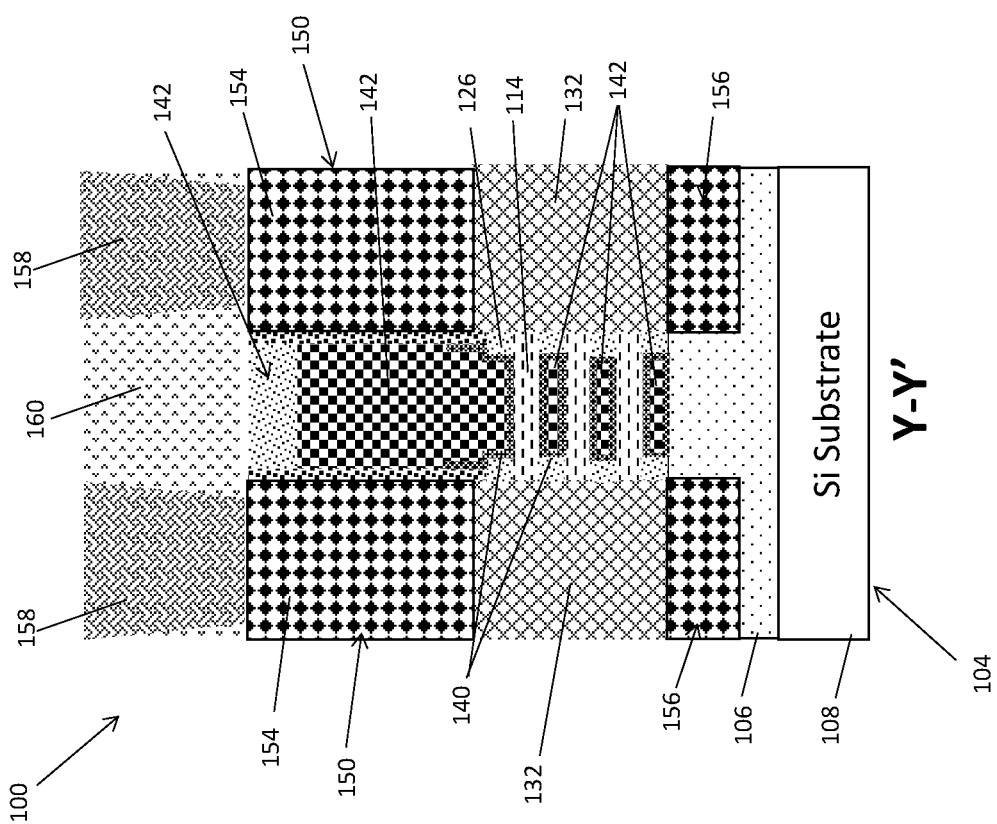
FIG. 17B depicts the semiconductor device depicts the semiconductor device of FIG. 17A taken along line Y-Y'.

Turning to FIGS. 17A-17C, the semiconductor device 100 is illustrated following formation of a S/D contact via 158 on each all-around S/D contact 150. The S/D contact via 158 can be composed of a metal material including (e.g., tungsten, aluminum, copper, etc.), and can be formed according to a series of patterning and etching techniques. For example, a second ILD layer 160 can be deposited on an upper surface of the all-around contacts 150 and replacement gate structure 142, patterned to form via trenches (not shown), and then filled with an electrically conductive metal material. A CMP process can be performed, which stops on the remaining ILD 160 to form the S/D contact vias 158. In one or more embodiments of the invention, the upper surface of the via contacts 158 is flush (i.e., co-planar) with the upper surface of the ILD 160 as further illustrated in FIG. 17B.

As described herein, various non-limiting embodiments of the invention provide a semiconductor device including all-around S/D contacts. Unlike conventional S/D contacts, the all-around S/D contacts encapsulate the S/D epi, thereby increasing their overall contact interface. In this manner, the semiconductor device can be provided with a reduced footprint along with reduced contact resistance in the source/drain regions.

Aspects of the present invention are described herein with reference to flowchart illustrations and/or block diagrams of methods, and apparatus (devices) products according to embodiments of the invention. The flowchart and block diagrams in the Figures illustrate the architecture, functionality, and operation of possible implementations of the device and method of fabricating the device according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present invention can be a device and/or method of fabricating the device at any possible technical detail level of integration. The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming at least one semiconductor nanosheet in a channel region of a semiconductor wafer;
   covering a first source/drain epitaxy structure formed on first sacrificial region with a first interlayer dielectric (ILD), and covering the second source/drain epitaxy structure formed on a second sacrificial layer with a second ILD; and
   replacing the first and second sacrificial regions and a portion of the first and second ILDs with an electrically conductive material to form an all-around source/drain contact that encapsulates the first and second source/drain epitaxy structures.

2. The method of claim 1, further comprising growing, from the first sacrificial region, the first source/drain epitaxy structure to contact a first end of the at least one nanosheet, and growing, from the second sacrificial region, the second source/drain epitaxy structure to contact an opposing second end of the at least one nanosheet
   wherein the first and second source/drain epitaxy structures each have a pair of opposing epitaxy sidewalls extending between an upper epitaxy surface and a lower epitaxy surface, and wherein the electrically conductive material contacts the upper epitaxy surface, the lower epitaxy surface and one of the epitaxy sidewalls.

3. The method of claim 2, wherein forming the all-around source/drain contact comprises:
   performing a first selective etching process to remove the portion of the first and second ILDs while maintaining the source/drain epitaxy structure to form ILD trenches that expose the first and second sacrificial regions; and
   performing a second selective etching process that removes the first and second sacrificial regions while maintaining the source/drain epitaxy structure to form a source/drain trench; and
   filling the ILD trenches and source/drain trench with an electrically conductive material to form the all-around source/drain contact.

4. The method of claim 3, wherein the source/drain trench extends laterally between the ILD trenches and completely beneath the source/drain epitaxy structure.

5. The method of claim 4, wherein filling the source/drain trench forms a lower portion of the all-around source/drain contact, and filling the ILD trenches forms an upper portion and sidewalls of the all-around source/drain contact, the sidewalls extending between the upper portion and the lower portion.

6. The method of claim 5, wherein forming at least one semiconductor nanosheet comprises:
   forming, on a buried insulator layer of the semiconductor wafer, a vertical stack of a plurality of sacrificial semiconductor sheets and a plurality of active semiconductor nanosheets in an alternating series arrangement with respect to one another; and
   selectively etching the plurality of sacrificial nanosheets while maintaining the active semiconductor nanosheets to form the at least one semiconductor nanosheet being suspended above a portion of the buried insulator layer located in the channel region.

7. The method of clam 6, further comprising performing the second selective etching process using an etchant that attacks the sacrificial regions while preserving the buried insulator layer such that the source/drain trench does not extend into the channel region.

8. A method of forming a nanosheet field effect transistor (FET), the method comprising:
   forming, on a semiconductor wafer, a nanosheet stack, and forming a gate structure that wraps around a portion of the nanosheet stack to define a channel region of the nanosheet FET;
   forming first and second sacrificial regions on the semiconductor substrate, wherein the gate structure is used to self-align the first and second sacrificial regions with respect to sidewalls of the nanosheet stack;
   growing, from the first sacrificial region, a first source/drain epitaxy structure that contacts a first side of the nanosheet stack, and growing, from the second sacrificial region, a second source/drain epitaxy structure that contacts an opposing second side of the nanosheet stack; and
   replacing the first and second sacrificial regions with an electrically conductive material to form an all-around source/drain contacts that encapsulate the source/drain epitaxy structures.

9. The method of claim 8, wherein replacing the first and second sacrificial regions comprises:
   covering the first source/drain epitaxy structure with a first interlayer dielectric (ILD), and covering the second source/drain epitaxy structure with a second ILD; and
   replacing the first and second sacrificial regions and a portion of the first and second ILDs with the electrically conductive material to form the all-around source/drain contact.

10. The method of claim 9, wherein forming the all-around source/drain contact comprises:
   performing a first selective etching process to remove the portion of the first and second ILDs while maintaining the source/drain epitaxy structure to form ILD trenches that expose the first and second sacrificial regions; and
   performing a second selective etching process that removes the first and second sacrificial regions while maintaining the source/drain epitaxy structure to form a source/drain trench; and
   filling the ILD trenches and the source/drain trench with the electrically conductive material to form the all-around source/drain contact.

11. The method of claim 10, wherein the source/drain trench extends laterally between the ILD trenches and completely beneath the source/drain epitaxy structure.

12. The method of claim 11, wherein filling the source/drain trench forms a lower portion of the all-around source/drain contact, and filling the ILD trenches forms an upper portion and sidewall portions of the all-around source/drain contact, the sidewall portions extending between the upper portion and the lower portion.

13. The method of claim 12 wherein all of the upper portion, sidewall portions, and lower portion directly contact the source/drain epitaxy structure.

14. The method of claim 8, wherein forming the nanosheet stack further includes forming a vertical stack of a plurality of active semiconductor sheets and a plurality of sacrificial nanosheets in an alternating series arrangement with respect to one another.

15. The method of claim 14, further comprising selectively etching the plurality of sacrificial nanosheets while maintaining the active semiconductor nanosheets to form a channel of the nanosheet FET.

16. The method of claim 1, wherein the electrically conductive material completely surrounds the first and second source/drain epitaxy structures.

\* \* \* \* \*